United States Patent
Chen et al.

(10) Patent No.: US 9,053,820 B2
(45) Date of Patent: Jun. 9, 2015

(54) INTERNAL DATA LOAD FOR NON-VOLATILE STORAGE

(71) Applicant: SanDisk Technologies Inc., Plano, TX (US)

(72) Inventors: Wenzhou Chen, San Jose, CA (US); Dana Lee, Saratoga, CA (US); Zhenming Zhou, San Jose, CA (US); Guirong Liang, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/456,984

(22) Filed: Aug. 11, 2014

(65) Prior Publication Data

US 2014/0347925 A1 Nov. 27, 2014

Related U.S. Application Data

(62) Division of application No. 13/786,190, filed on Mar. 5, 2013, now Pat. No. 8,861,269.

(51) Int. Cl.
*G11C 16/10* (2006.01)
*G11C 16/26* (2006.01)
*G11C 16/34* (2006.01)
*G11C 11/56* (2006.01)
(Continued)

(52) U.S. Cl.
CPC ............ *G11C 11/5628* (2013.01); *G11C 16/26* (2013.01); *G11C 16/10* (2013.01); *G11C 16/3418* (2013.01); *G11C 16/28* (2013.01); *G11C 11/5642* (2013.01);
(Continued)

(58) Field of Classification Search
CPC ........ G11C 16/10; G11C 16/26; G11C 16/28; G11C 11/5642; G11C 11/5628; G11C 16/3418; G11C 2211/5641

USPC ............... 365/185.2, 185.18, 185.03, 185.23, 365/185.17, 185.21
See application file for complete search history.

(56) References Cited

U.S. PATENT DOCUMENTS 7,495,962 B2 2/2009 Mokhlesi
7,898,864 B2 3/2011 Dong
(Continued)

FOREIGN PATENT DOCUMENTS

WO 2007143398 12/2007

OTHER PUBLICATIONS

International Search Report for PCT/US2014/017846, Int'l filing date Feb. 21, 2014, mailed Jun. 27, 2014.
(Continued)

*Primary Examiner* — Ly D Pham
(74) *Attorney, Agent, or Firm* — Vierra Magen Marcus LLP

(57) ABSTRACT

Techniques are disclosed herein for performing an Internal Data Load (IDL) to sense non-volatile storage elements. Read pass voltages that are applied to the two neighbor word lines to a selected word line may be adjusted to result in a more accurate IDL. The read pass voltage for one neighbor may be increased by some delta voltage, whereas the read pass voltage for the other neighbor may be decreased by the same delta voltage. In one aspect, programming of an upper page of data into a word line that neighbors a target word line is halted to allow lower page data in the target memory cells to be read using an IDL and preserved in data latches while programming the upper page in the neighbor word completes. Preservation of the lower page data provides for a cleaner lower page when later programming the upper page into the target memory cells.

20 Claims, 20 Drawing Sheets

(51) Int. Cl.
*G11C 16/04* (2006.01)
*G11C 16/28* (2006.01)

(52) U.S. Cl.
CPC ....... *G11C 16/0483* (2013.01); *G11C 16/3427* (2013.01); *G11C 16/3454* (2013.01); *G11C 2211/5648* (2013.01)

(56) References Cited

U.S. PATENT DOCUMENTS

| | | |
|---|---|---|
| 7,916,547 B2 | 3/2011 | Hosono |
| 2008/0158985 A1 | 7/2008 | Mokhlesi |
| 2009/0016110 A1 | 1/2009 | Choi et al. |
| 2011/0170347 A1 | 7/2011 | Shibata et al. |
| 2012/0163096 A1 | 6/2012 | Futatsuyama et al. |
| 2012/0182813 A1 | 7/2012 | Minamoto |

OTHER PUBLICATIONS

Notice of Allowance for U.S. Appl. No. 13/786,190, filed Mar. 5, 2013, mailed May 13, 2014.

Notice of Allowance—Corrected Notice of Allowability for U.S. Appl. No. 13/786,190, mailed Aug. 11, 2014.

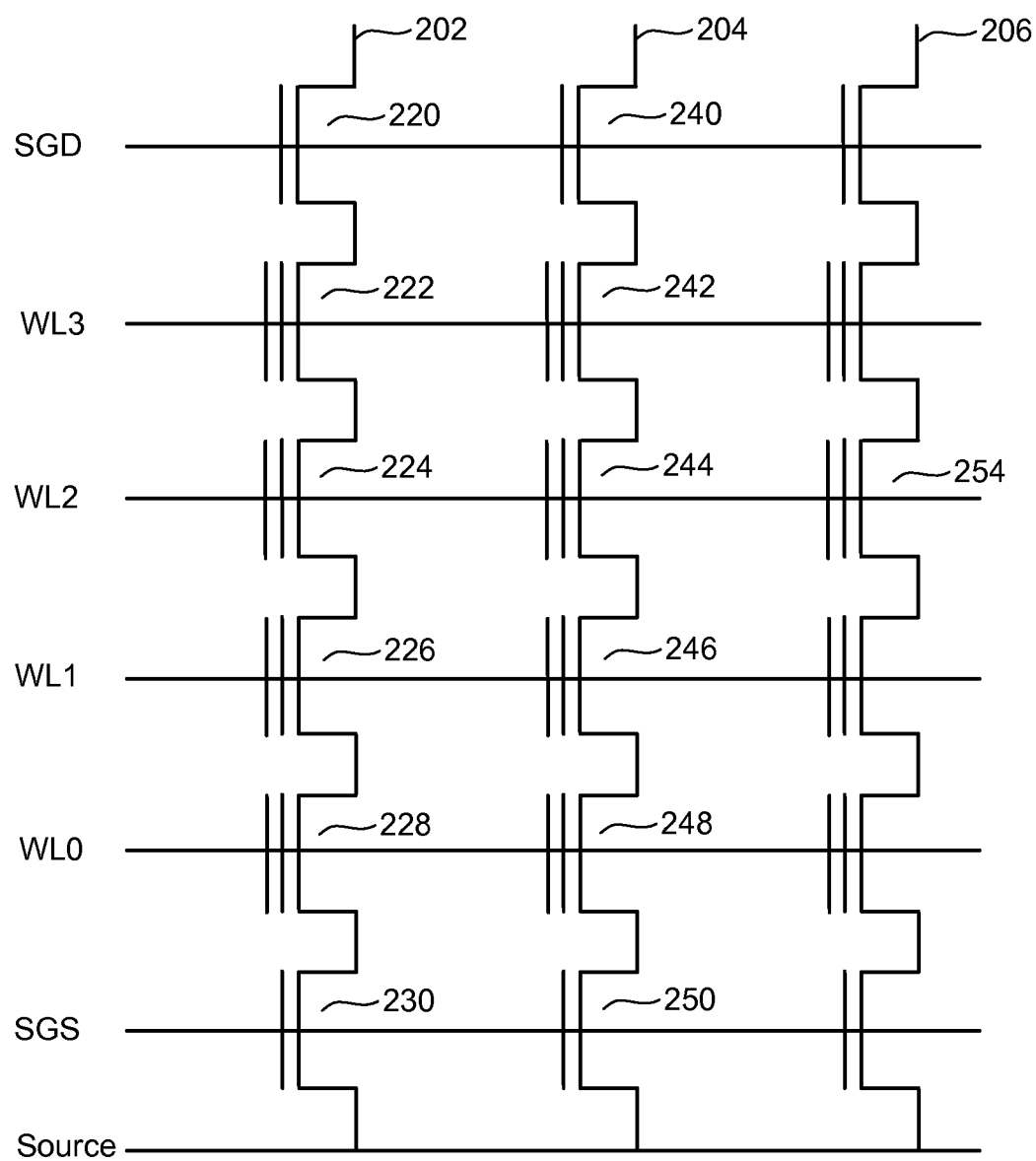

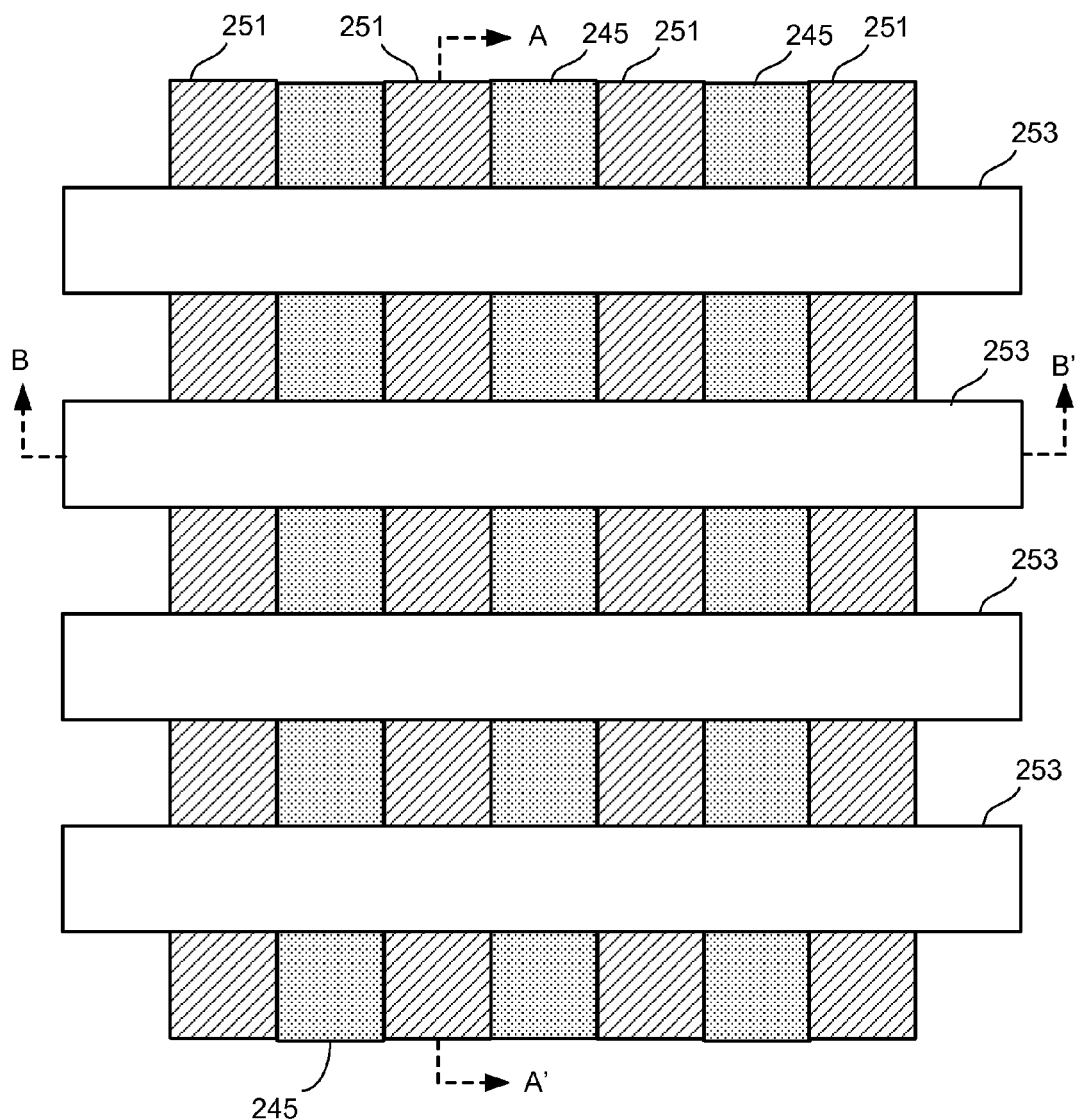

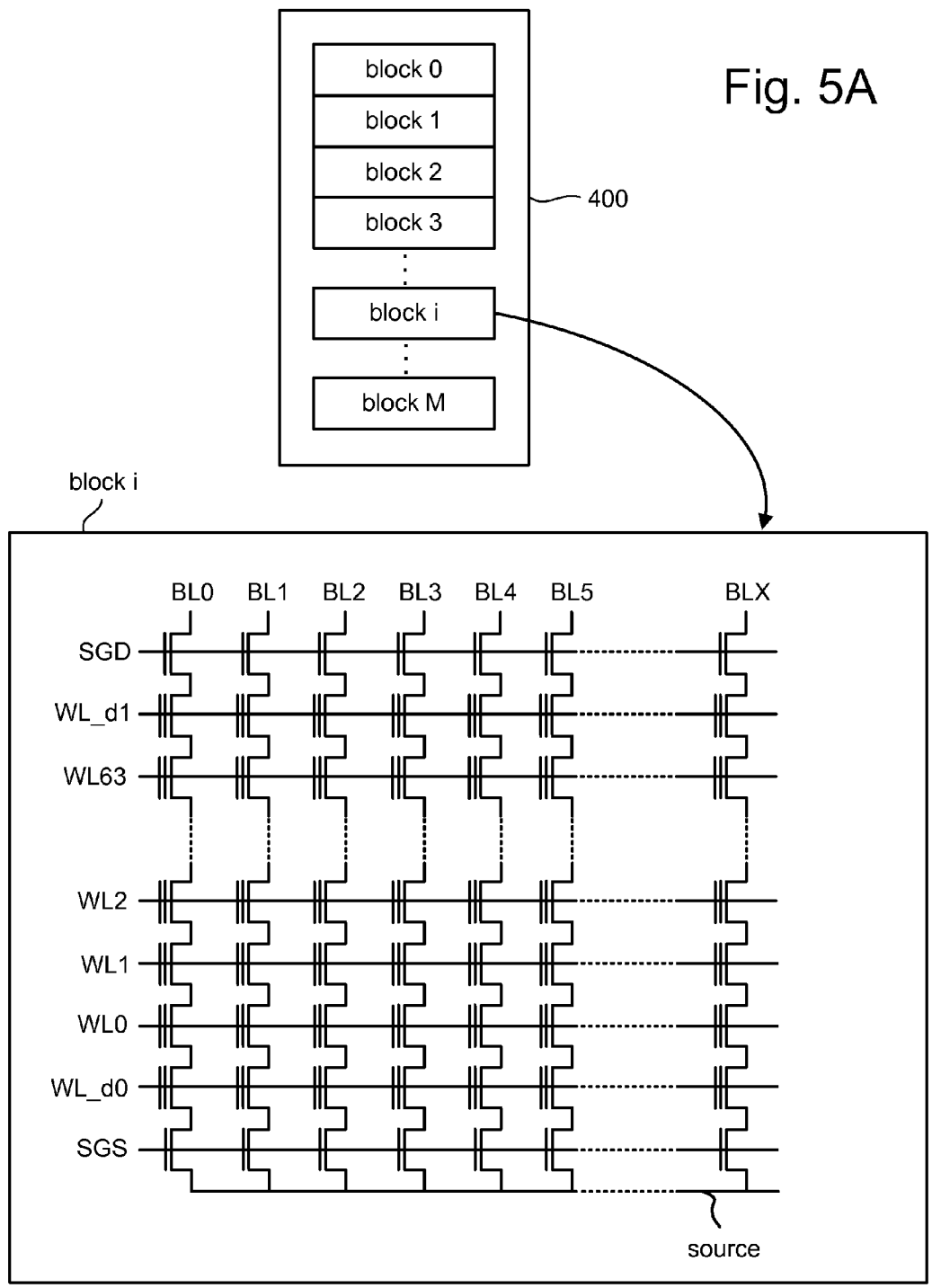

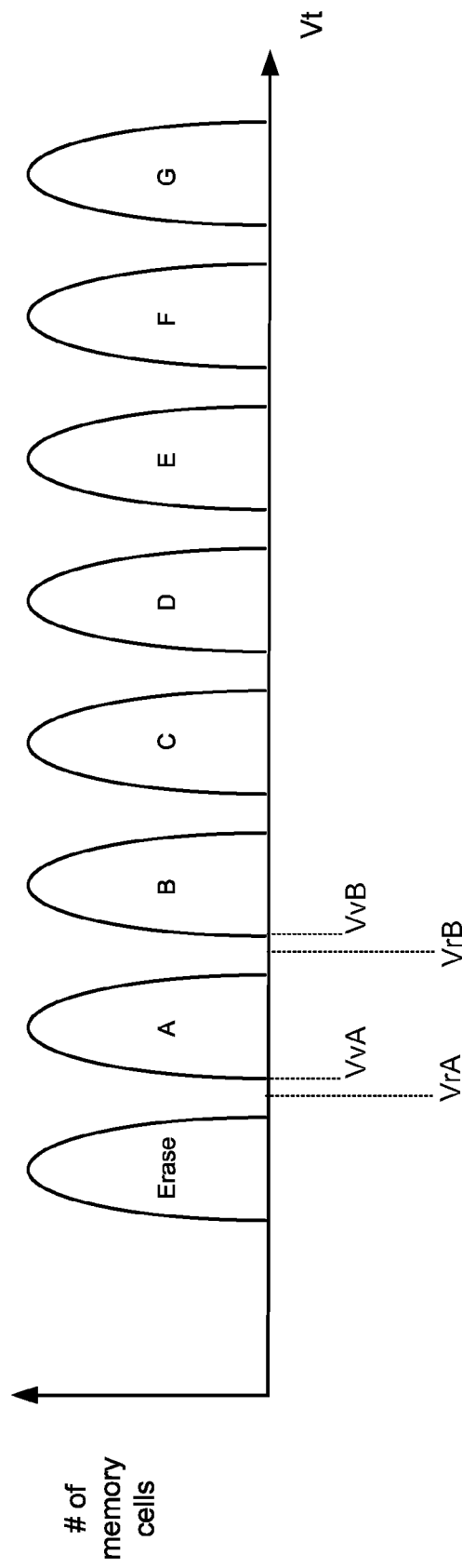
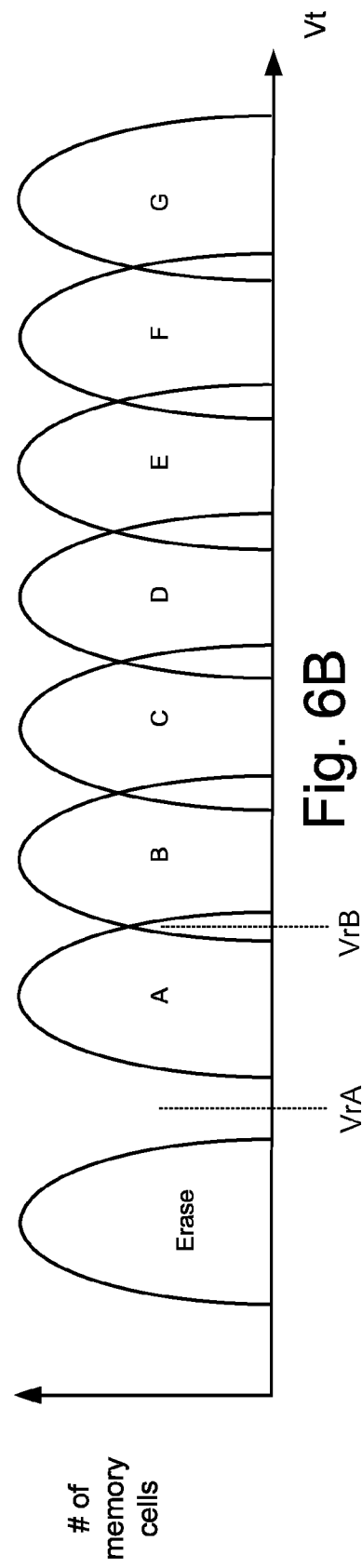

First programming pass

Second programming pass

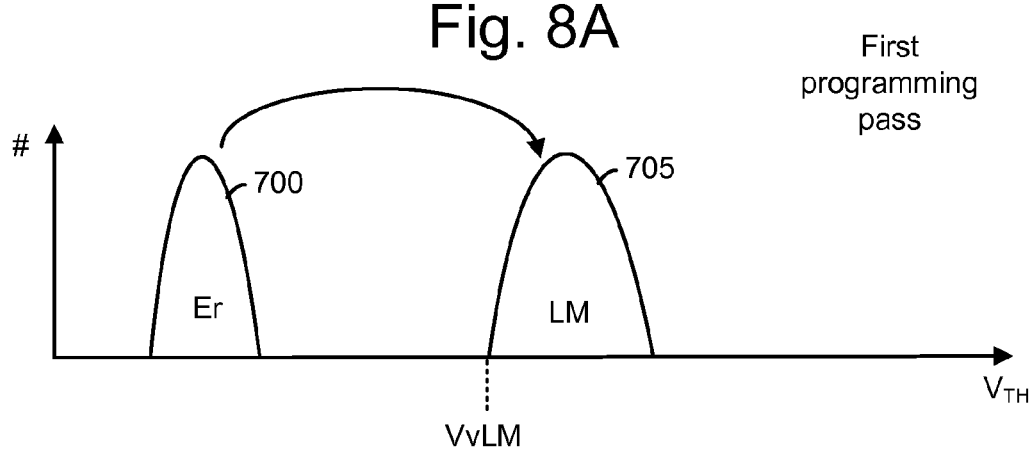
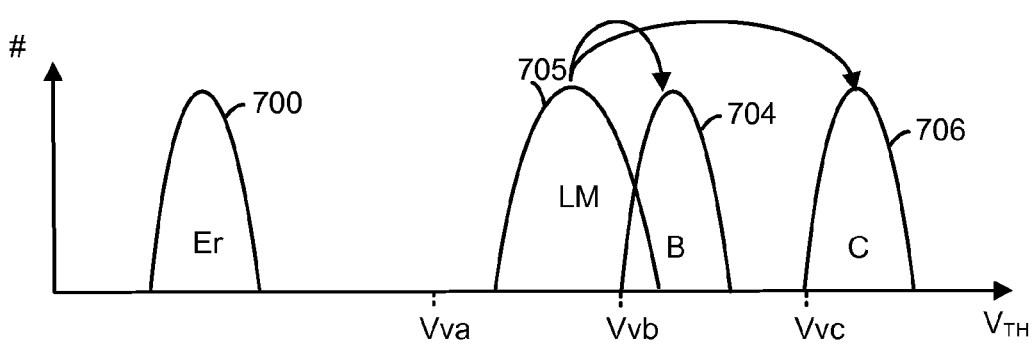
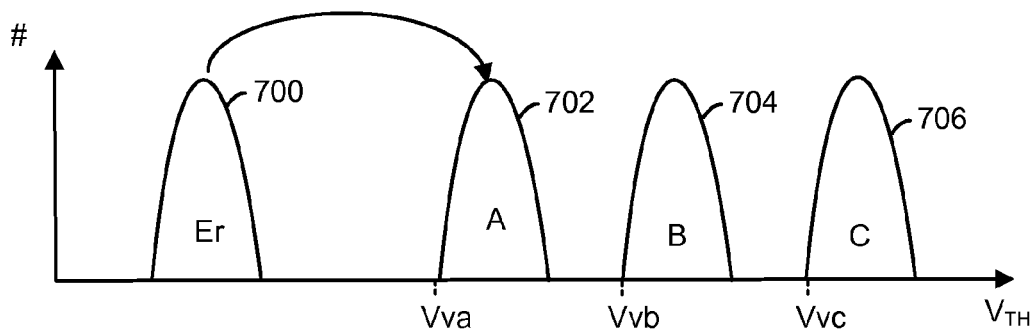

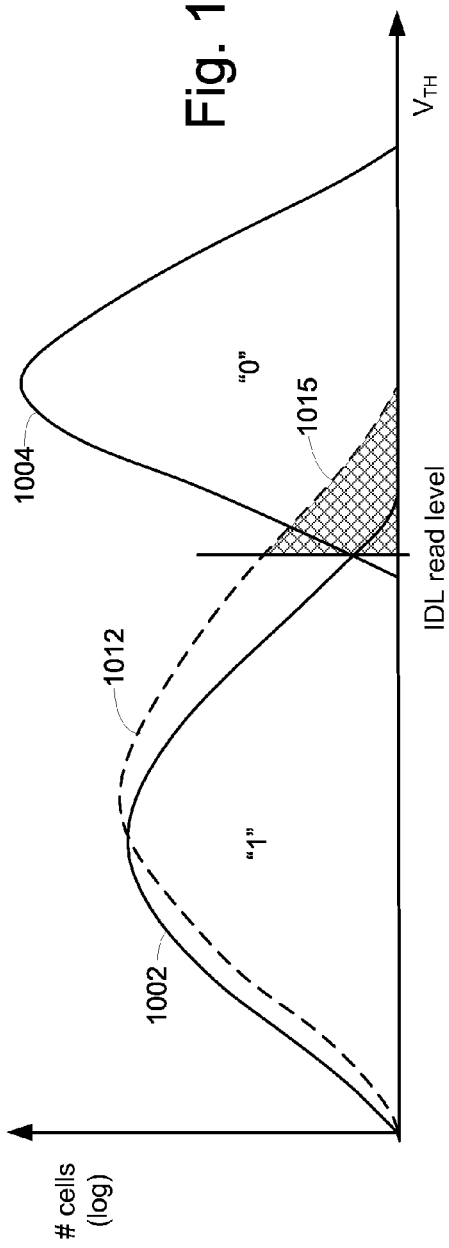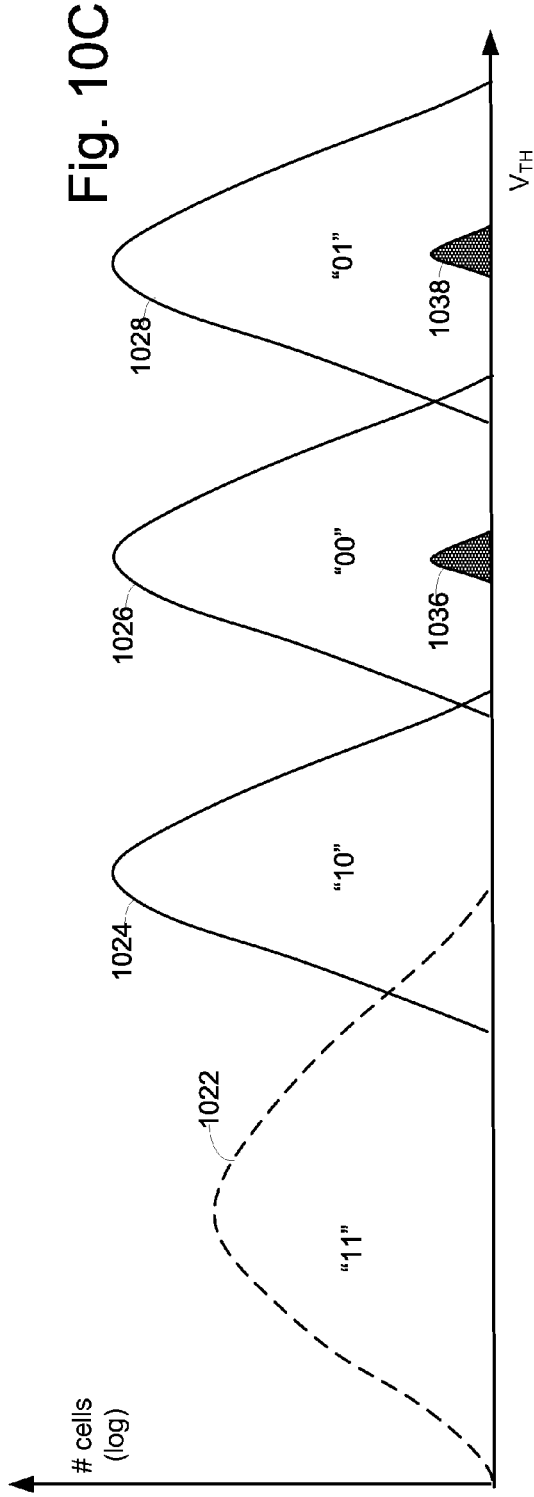

INTERNAL DATA LOAD FOR NON-VOLATILE STORAGE

PRIORITY CLAIM

This application is a divisional application of U.S. patent application Ser. No. 13/786,190, filed Mar. 5, 2013, now U.S. Pat. No. 8,861,269, which is incorporated herein by reference.

BACKGROUND

The present disclosure relates to technology for non-volatile memory.

Semiconductor memory has become more popular for use in various electronic devices. For example, non-volatile semiconductor memory is used in personal navigation devices, cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

When programming a group of multi-state flash memory cells, programming a first bit in each cell may be referred to as programming a first or lower page. Similarly, programming a second bit in each cell may be referred to as programming a second or upper page.

Sometimes, the memory cells are read back after programming the first page but prior to programming the second page. This read could store the first page into a set of data latches on the memory chip. Such a read may be referred to as an Internal Data Load (IDL) as it results in the first page of data being loaded into the data latches without data being transferred from off the chip to the data latches.

BRIEF DESCRIPTION OF THE DRAWINGS

FIG. 2A is a circuit diagram of three NAND strings with associated word lines.
FIG. 2B is a top view of the three NAND strings and word lines.
FIG. 5A depicts an exemplary structure of memory cell array.
FIG. 6A depicts an example set of Vt distributions.
FIG. 6B depicts an example set of Vt distributions.
FIGS. 8A, 8B and 8C depict one embodiment of a three pass programming sequence.
FIG. 10B depicts example threshold distributions to illustrate a potential for misreads that may occur.
FIG. 10C shows four threshold distributions after programming an upper page without attempting to correct misreads to show a potential for mis-programming.

DETAILED DESCRIPTION

Techniques are disclosed herein for operating non-volatile storage. Techniques include ways of performing an Internal Data Load (IDL). In one embodiment, the read pass voltages that are applied to the two neighbor word lines to a selected word line are adjusted to result in a more accurate IDL. The read pass voltage for one neighbor may be increased by some delta voltage, whereas the read pass voltage for the other neighbor may be decreased by the same delta voltage. By increasing one read pass voltage and decreasing the other, the neutral Vt of the selected memory cells is not impacted. Moreover, the increased read pass voltage on the one neighbor can help improve read accuracy, whereas the decreased read pass voltage on the other neighbor does not hurt read accuracy. A reason for the foregoing relates to whether the memory cells on the neighbor word line have an upper page programmed yet or not. In one embodiment, the neighbor word line with the upper page programmed receives the increased read pass voltage and the neighbor word line with the upper page not yet programmed receives the decreased read pass voltage. The increase and decrease of the read pass voltages may be relative to a read that is performed when both neighbor word lines have their upper pages programmed. Further details are discussed below.

In one embodiment, programming of an upper page of data into a word line that neighbors a target word line that is about to have an upper page programmed is paused to allow lower page data that was already programmed into target memory cells associated with the target word line preserved. The lower page data can be preserved in a set of data latches while programming of the upper page in the neighbor word line resumes and is completed. This preservation of the lower page data provides for a cleaner lower page when later programming the upper page into the target memory cells. Note that programming of the upper page may rely on the lower page data. Further details are discussed below.

Example Memory System and Operation

Figure 1A:
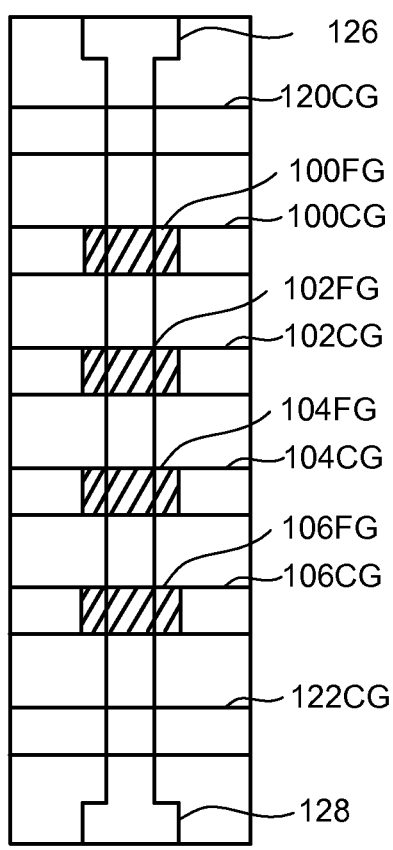
FIG. 1A is a top view of a NAND string.
Figure 1B:
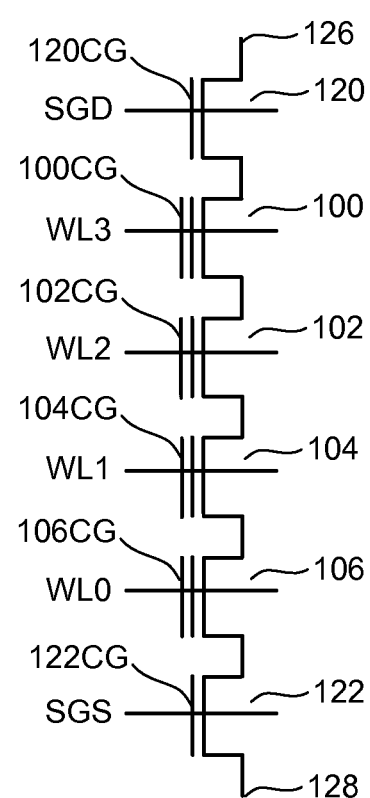
FIG. 1B is an equivalent circuit diagram of the NAND string of FIG. 1A.

One example of a memory system suitable for implementing embodiments uses a NAND flash memory architecture, which includes connecting multiple transistors in series between two select gates. The transistors connected in series and the select gates are referred to as a NAND string. FIG. 1A is a top view showing one NAND string. FIG. 1B is an equivalent circuit thereof. The NAND string includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, (where WL denotes "word line"), control gate 102CG is connected to WL2, control gate 104CG is connected to WL1, and control gate 106CG is connected to WL0. In one embodiment, transistors 100, 102, 104 and 106 are each storage elements, also referred to as memory cells. In other embodiments, the storage elements may include multiple transistors or may be different than depicted. Select gate 120 is connected to select line SGD. Select gate 122 is connected to select line SGS.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

FIG. 2A shows three NAND strings 202, 204 and 206 of a memory array having many more NAND strings. Each of the NAND strings of FIG. 2A includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each NAND string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 252. Word line WL1 is connected to the control gates for memory cell 226 and memory cell 246. Word line WL0 is connected to the control gates for memory cell 228 and memory cell 248. As can be seen, each bit line and the respective NAND string comprises the columns of the array of memory cells. The word lines (WL3, WL2, WL1 and WL0) comprise the rows of the array.

FIG. 2B is a top view of a portion of an array of NAND flash memory cells. The array includes bit lines 251 and word lines 253. Shallow trench isolation (STI) structures 245 are depicted between the bit lines 251 (note the bit lines are not at the same level as the STI structures 245). Note that FIG. 2B does not show all of the other details of the flash memory cells. Note that a NAND string can have fewer or more memory cells than depicted in FIGS. 2A and 2B. For example, some NAND strings will include eight memory cells, 16 memory cells, 32 memory cells, 64 memory cells, 128 memory cells, etc. The discussion herein is not limited to any particular number of memory cells in a NAND string. Furthermore, a wordline can have more or fewer memory cells than depicted in FIGS. 2A and 2B. For example, a wordline can include thousand or tens of thousands of memory cells. The discussion herein is not limited to any particular number of memory cells in a wordline.

Each storage element can store data. For example, when storing one bit of digital data, the range of possible threshold voltages (VTH) of the storage element is divided into two ranges which are assigned logical data "1" and "0." In one example of a NAND type flash memory, the VTH is negative after the storage element is erased, and defined as logic "1." The VTH after a program operation is positive and defined as logic "0." When the VTH is negative and a read is attempted, the storage element will turn on to indicate logic "1" is being stored. When the VTH is positive and a read operation is attempted, the storage element will not turn on, which indicates that logic "0" is stored. A storage element can also store multiple levels of information, for example, multiple bits of digital data. In this case, the range of VTH value is divided into the number of levels of data. For example, if four levels of information are stored, there will be four VTH ranges assigned to the data values "11", "10", "01", and "00." In one example of a NAND type memory, the VTH after an erase operation is negative and defined as "11". Positive VTH values are used for the states of "10", "01", and "00." The specific relationship between the data programmed into the storage element and the threshold voltage ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the VTH of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 2A, the program voltage will also be applied to the control gates of storage elements 244 and 254.

Figure 3:
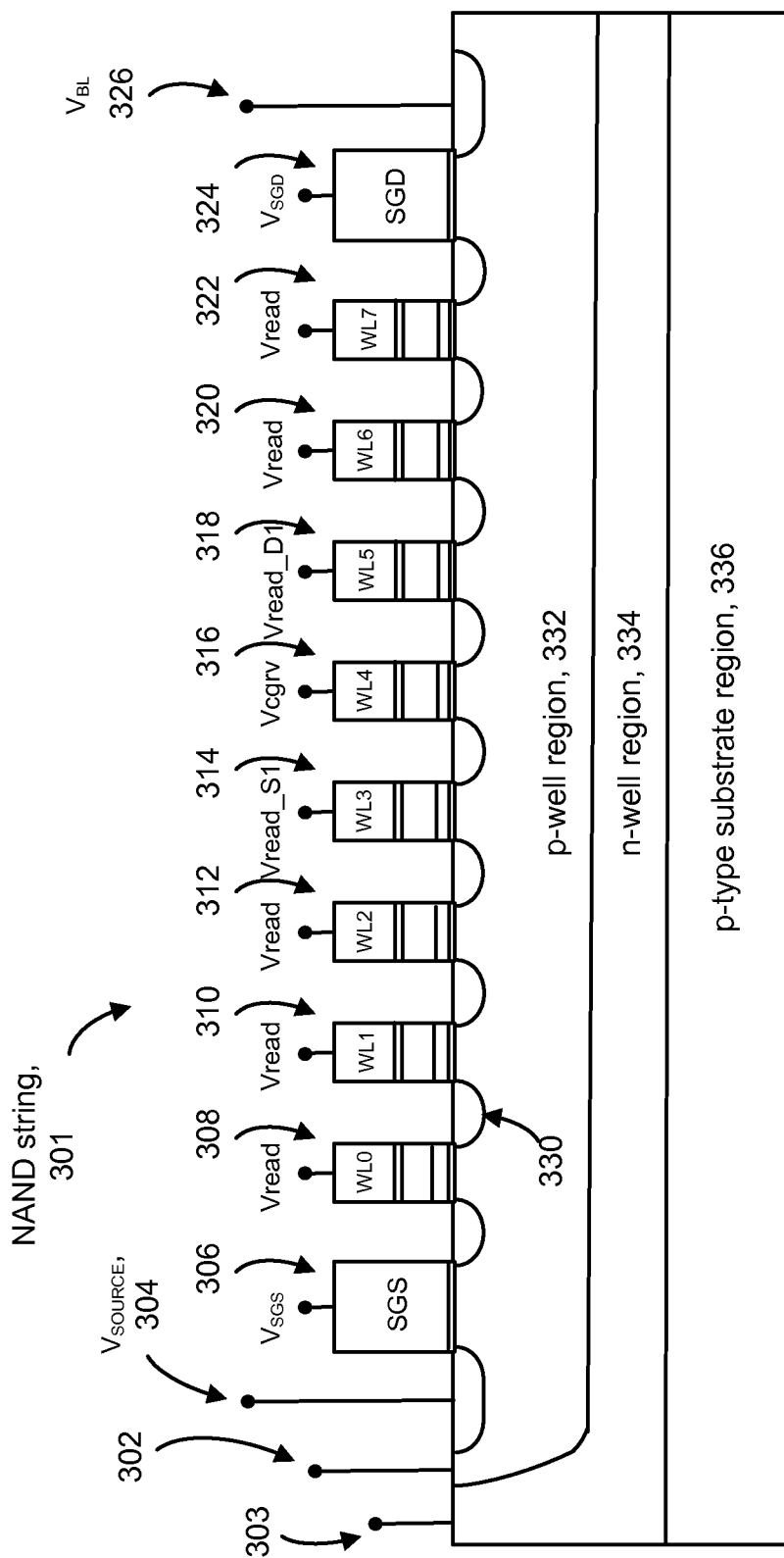
FIG. 3 depicts a cross-sectional view of a NAND string formed on a substrate.

FIG. 3 depicts a cross-sectional view of a NAND string formed on a substrate. The view is simplified and not to scale. The NAND string 301 includes a source-side select gate 306, a drain-side select gate 324, and eight storage elements 308, 310, 312, 314, 316, 318, 320 and 322, formed on a substrate 340. A number of source/drain regions, one example of which is source/drain region 330, are provided on either side of each storage element and the select gates 306 and 324.

In one approach, the substrate 340 employs a triple-well technology which includes a p-well region 332 within an n-well region 334, which in turn is within a p-type substrate region 336. The NAND string and its non-volatile storage elements can be formed, at least in part, on the p-well region. A source supply line 304 with a potential of $V_{SOURCE}$ is provided in addition to a bit line 326 with a potential of $V_{BL}$. Voltages, such as body bias voltages, can also be applied to the p-well region 332 via a terminal 302 and/or to the n-well region 334 via a terminal 303. During a read or verify operation, a control gate voltage VCGRV is provided on a selected word line, in this example, WL4, which is associated with storage element 316. This read could include an IDL. Further, recall that the control gate of a storage element may be provided as a portion of the word line. For example, WL0, WL1, WL2, WL3, WL4, WL5, WL6 and WL7 can extend via the control gates of storage elements 308, 310, 312, 314, 316, 318, 320 and 322, respectively. A pass voltage, $V_{READ}$ is applied to the remaining word lines associated with NAND string 301. $V_{SGS}$ and $V_{SGD}$ are applied to the select gates 306 and 324, respectively.

Note that the same pass voltage is not necessarily applied to each memory cell. FIG. 3 shows one example of voltages applied during one embodiment of a read or verify process. Memory cell 316, which is on WL4, is the selected memory cell. This cell has Vcgrv applied to its control gate. In this example Vread_S1 is applied to memory cell 314 and Vread_D1 is applied to memory cell 318. Other unselected memory cells have Vread applied to their control gates. The voltages Vread_S1 and Vread_D1 may provide for more accurate reading of the target memory cell 316. In one embodiment, Vread_S1 is greater than Vread. In one embodiment, Vread_D1 is greater than Vread. In one embodiment, Vread_S1 and Vread_D1 are about the same. In one embodiment, Vread_S1 is greater than Vread_D1. In one embodiment, Vread_S1 is less than Vread_D1.

Figure 4:
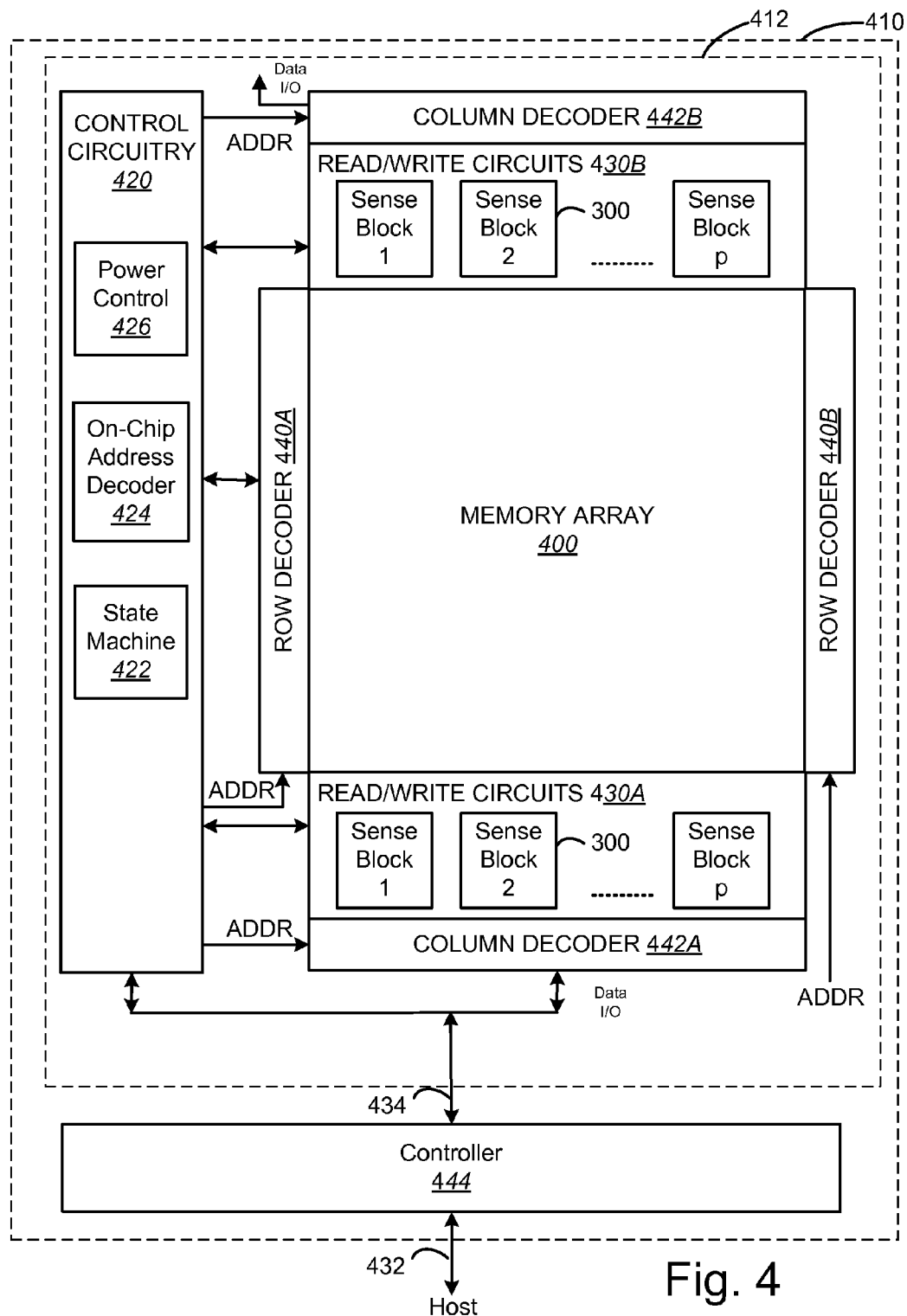
FIG. 4 illustrates a non-volatile storage device that may include one or more memory die or chips.

FIG. 4 illustrates a non-volatile storage device 410 that may include one or more memory die or chips 412. Memory die 412 includes an array (two-dimensional or three dimensional) of memory cells 400, control circuitry 420, and read/write circuits 430A and 430B. In one embodiment, access to the memory array 400 by the various peripheral circuits is implemented in a symmetric fashion, on opposite sides of the array, so that the densities of access lines and circuitry on each side are reduced by half. The read/write circuits 430A and 430B include multiple sense blocks 300 which allow a page of memory cells to be read or programmed in parallel. The memory array 400 is addressable by word lines via row decoders 440A and 440B and by bit lines via column decoders 442A and 442B. In a typical embodiment, a controller 444 is included in the same memory device 410 (e.g., a removable storage card or package) as the one or more memory die 412. Commands and data are transferred between the host and controller 444 via lines 432 and between the controller and the one or more memory die 412 via lines 434. One implementation can include multiple chips 412.

Control circuitry 420 cooperates with the read/write circuits 430A and 430B to perform memory operations on the memory array 400. The control circuitry 420 includes a state machine 422, an on-chip address decoder 424 and a power control module 426. The state machine 422 provides chip-level control of memory operations. The on-chip address decoder 424 provides an address interface to convert between the address that is used by the host or a memory controller to the hardware address used by the decoders 440A, 440B, 442A, and 442B. The power control module 426 controls the power and voltages supplied to the word lines and bit lines during memory operations. In one embodiment, power control module 426 includes one or more charge pumps that can create voltages larger than the supply voltage.

In one embodiment, one or any combination of control circuitry 420, power control circuit 426, decoder circuit 424, state machine circuit 422, decoder circuit 442A, decoder circuit 442B, decoder circuit 440A, decoder circuit 440B, read/write circuits 430A, read/write circuits 430B, and/or controller 444 can be referred to as one or more managing circuits.

FIG. 5A depicts an exemplary structure of memory cell array 400. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller (described below) calculates the ECC parity when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 5A also shows more details of block i of memory array 400. Block i includes X+1 bit lines and X+1 NAND strings. Block i also includes 64 data word lines (WL0-

WL63), two dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 5B:
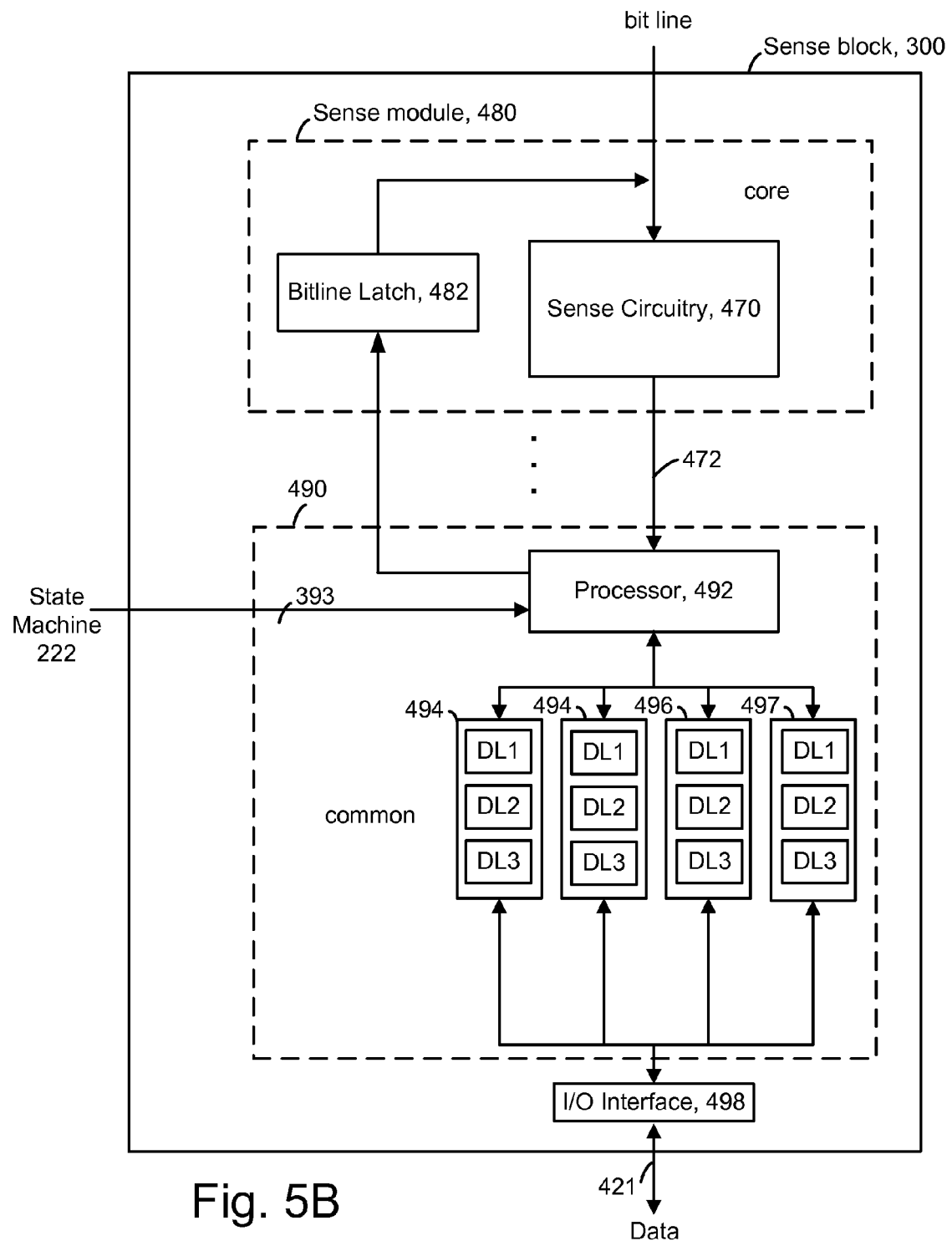
FIG. 5B is a block diagram depicting one embodiment of a sense block.

FIG. 5B is a block diagram depicting one embodiment of a sense block 300. An individual sense block 300 is partitioned into a core portion, referred to as a sense module 480, and a common portion 490. In one embodiment, there is a separate sense module 480 for each bit line and one common portion 490 for a set of multiple sense modules 480. In one example, a sense block 300 will include one common portion 490 and eight sense modules 480. Each of the sense modules in a group will communicate with the associated common portion via a data bus 472.

Sense module 480 comprises sense circuitry 470 that determines whether a conduction current in a connected bit line is above or below a predetermined threshold level. Sense module 480 also includes a bit line latch 482 that is used to set a voltage condition on the connected bit line. For example, a predetermined state latched in bit line latch 482 will result in the connected bit line being pulled to a state designating program inhibit (e.g., 1.5-3 V). As an example, a flag=0 can inhibit programming, while flag=1 does not inhibit programming.

Common portion 490 comprises a processor 492, three example sets of data latches 494 and an I/O Interface 498 coupled between the sets of data latches 494 and data bus 421. One set of data latches can be provided for each sense module, and three data latches identified by DL1, DL2, and DL3 may be provided for each set. The use of the data latches is further discussed below.

Processor 492 performs computations. For example, one of its functions is to determine the data stored in the sensed storage element and store the determined data in the set of data latches. At least some of the data latches in a set of data latches (e.g., 494) are used to store data bits determined by processor 492 during a read operation. At least some of the data latches in a set of data latches are also used to store data bits imported from the data bus 421 during a program operation. The imported data bits represent write data meant to be programmed into the memory. I/O interface 498 provides an interface between data latches 494-497 and the data bus 421.

In one embodiment, data is stored in the DL1 and DL2 latches at the beginning of the program operation. For example, lower page data may be stored in DL1 and upper page data may be stored in DL2. In one embodiment, lower page data that is read from memory cells during an IDL is stored in the DL1 latches. DL3 may be used to store verify status, such as lockout status during programming. For example, when a memory cell's Vt has been verified a reaching its target level, the DL3 latch can be set to indicate this such that further programming of the memory cell may be inhibited. Note this describes programming two bits per memory cell. In one embodiment, during a read operation, the DL1 and DL2 latches are used to store the two bits that are read from the memory cell. Note that there may be more than two bits per memory cell. There can be one additional latch for each additional bit to be stored per memory cell.

During reading or other sensing, the state machine 422 controls the supply of different control gate voltages to the addressed storage element. As it steps through the various control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 393. It then computes a binary encoding for the memory state and stores the resultant data bits into data latches (e.g., 494). In another embodiment of the core portion, bit line latch 482 serves both as a latch for latching the output of the sense module 480 and as a bit line latch as described above.

Some implementations can include multiple processors 492. In one embodiment, each processor 492 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 492 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 494-497 from the data bus 421. The program operation, under the control of the state machine, comprises a series of programming voltage pulses applied to the control gates of the addressed storage elements. Each program pulse is followed by a read back (verify) to determine if the storage element has been programmed to the desired memory state. Processor 492 monitors the read back memory state relative to the desired memory state. When the two are in agreement, the processor 492 sets the bit line latch 482 so as to cause the bit line to be pulled to a state designating program inhibit. This inhibits the storage element coupled to the bit line from further programming even if program pulses appear on its control gate. In other embodiments, the processor initially loads the bit line latch 482 and the sense circuitry sets it to an inhibit value during the verify process.

Each set of data latch stacks 494-497 contains a stack of data latches corresponding to the sense module 480, in one embodiment. In one embodiment, there are three data latches per sense module 480. All the DL1 and DL2 data latches corresponding to the read/write block of m storage elements can be linked together to form a block shift register so that a block of data can be input or output by serial transfer.

In one embodiment, one purpose of the DL1 and DL2 latches is to store data that is to be programmed into a storage element. For example, the storage elements may store two bits per storage element. In one embodiment, lower page data is initially stored into the DL1 latches and upper page data is initially stored into the DL2 latches.

In one embodiment, the storage elements store three bits per storage element. In this case, there may be an additional data latch (not depicted in FIG. 5B) for initially storing the third bit of data that is to be programmed into a storage element. In one embodiment, the storage elements four bits per storage element, in which there may be two additional data latches (not depicted in FIG. 5B) for initially storing the third and fourth bits of data that is to be programmed into a storage element. The storage elements could store more than four bits per storage element, in which case there may be one data latch for each bit.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example Vt distributions corresponding to data states for the memory cell array when each memory cell stores three bits of data. Other embodiment, however, may use more or fewer than three bits of data per memory cell. FIG. 6A shows eight Vt distributions corresponding to an Erase state and programmed states A-G. In one embodiment, the threshold voltages in the Erase state are negative and the threshold voltages in the programmed states A-G are positive. However, the threshold voltages in one or more of programmed states A-G may be negative. Some or all of the threshold voltages in the Erase state could be positive.

Between each of the data states Erase-G are read reference voltages used for reading data from memory cells. For example, FIG. 6A shows read reference voltage VrA between the erase state and the A-state, and VrB between the A-state and B-state. By testing whether the threshold voltage of a given memory cell is above or below the respective read reference voltages, the system can determine what state the memory cell is in.

At or near the lower edge of each programmed state are verify reference voltages. For example, FIG. 6A shows VvA for the A-state and VvB for the B-state. When programming memory cells to a given state, the system will test whether those memory cells have a threshold voltage greater than or equal to the verify reference voltage.

FIG. 6B illustrates that Vt distributions can partially overlap since the error correction algorithm can handle a certain percentage of cells that are in error. Note that in some embodiments, at one point in time the threshold voltage distribution may resemble FIG. 6A and at another time the threshold voltage distributions may overlap, as in FIG. 6B. For example, just after programming, the threshold voltage distribution may resemble FIG. 6A. However, over time, the threshold voltages of memory cells may shift, such that there may be overlap.

Also note that contrary to the equal spacing/width of the depicted threshold voltage distributions, various distributions may have different widths/spacings in order to accommodate varying amounts of susceptibility to data retention loss.

Figure 6C:
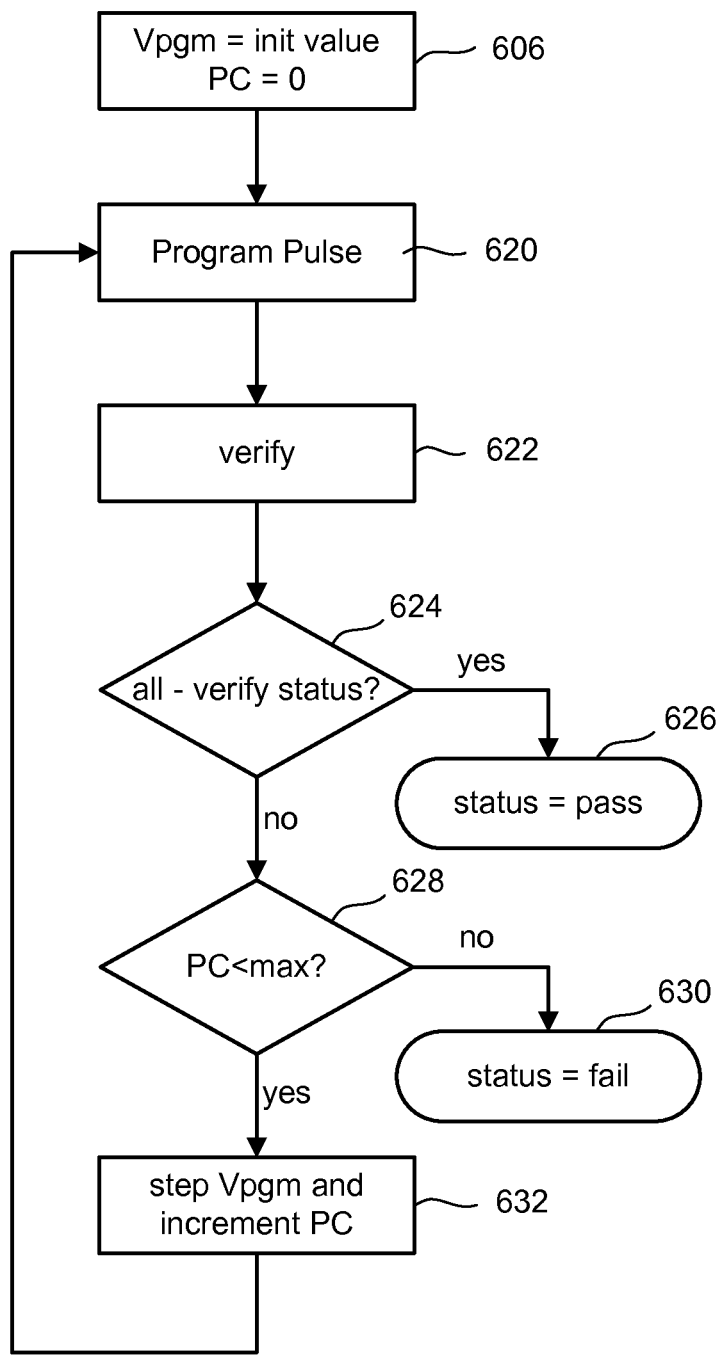
FIG. 6C is a flowchart describing one embodiment of a programming process.

FIG. 6C is a flowchart describing one embodiment of a programming process, which includes one or more verification steps. Any of the programming sequences described herein may be used, as well as other programming sequences.

In step 606, the program voltage (Vpgm) is set to an initial value. Also, in step 606, a program counter (PC) is initialized to zero. In step 620, a program pulse is applied.

In step 622, a verification process is performed. In step 624, it is determined whether memory cells have verified that their threshold voltages are at the final target voltage for that memory cell. Note that it is not required that every memory cell for a given state is verified to be at the appropriate threshold voltage. Error correction is able to correct for some memory cells being below their target threshold voltage. Error correction is able to correct for some memory cells being over-programmed. Step 624 is referring to all states having completed programming.

If verification passes, the programming process is completed successfully (status=pass) in step 626. If all of the memory cells are not all verified, then it is determined whether the program counter (PC) is less than a maximum value such as 20. If the program counter (PC) is not less than max (step 628), then the program process has failed (step 630). If the program counter (PC) is less than a maximum value (e.g., 20), then the program counter (PC) is incremented by 1 and the program voltage is stepped up to the next pulse in step 632. Subsequent to step 632, the process loops back to step 620 and the next program pulse is applied to the memory cells.

Figure 7A:
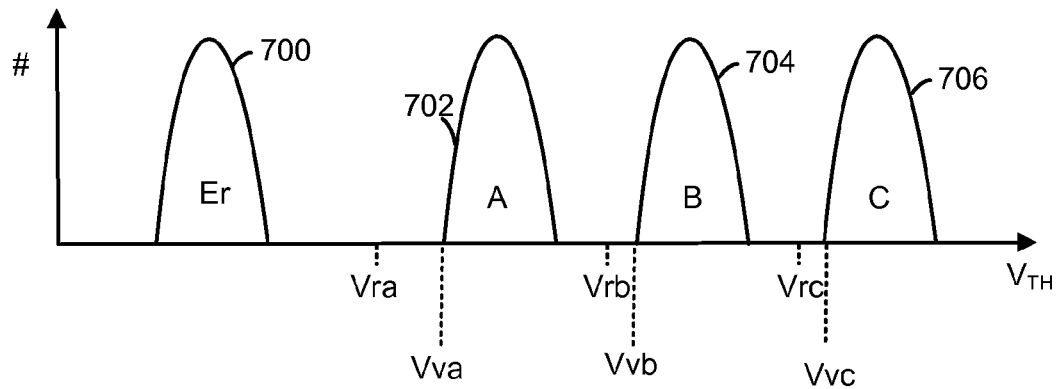
FIG. 7A depicts an example set of threshold voltage distributions for a four-state memory device in which each storage element stores two bits of data.

FIG. 7A depicts an example set of threshold voltage distributions for a four-state memory device in which each storage element stores two bits of data. A first threshold voltage (Vth) distribution 700 is provided for erased (Er-state) storage elements. Three Vth distributions 702, 704 and 706 represent programmed states A, B and C, respectively. In one embodiment, the threshold voltages in the Er-state are negative and the threshold voltages in the A, B and C distributions are positive. However, all or a part of the threshold distribution in the Er-state may be positive. Also, all or a part of the threshold distribution of the A-state may be negative (likewise for other data states).

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

Figure 7B:
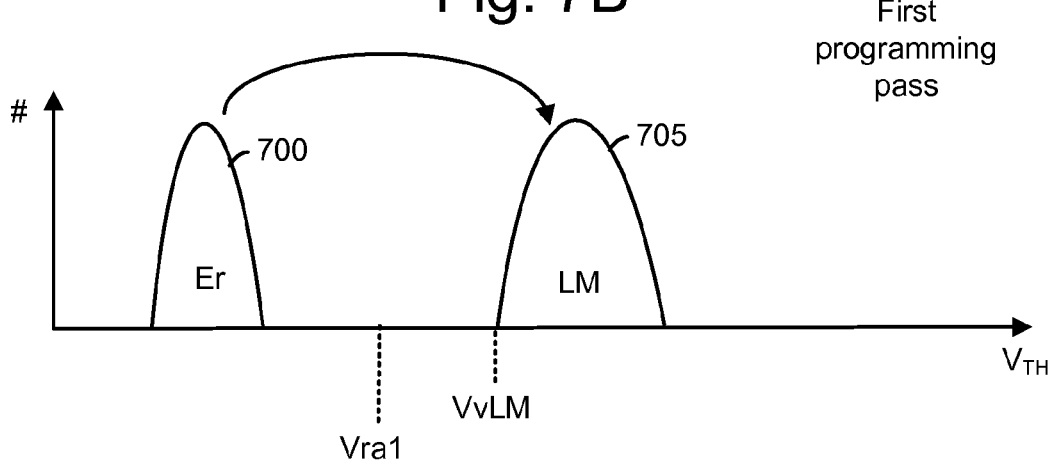
FIGS. 7B and 7C depict a two pass programming sequence in accordance with one embodiment.
Figure 7C:
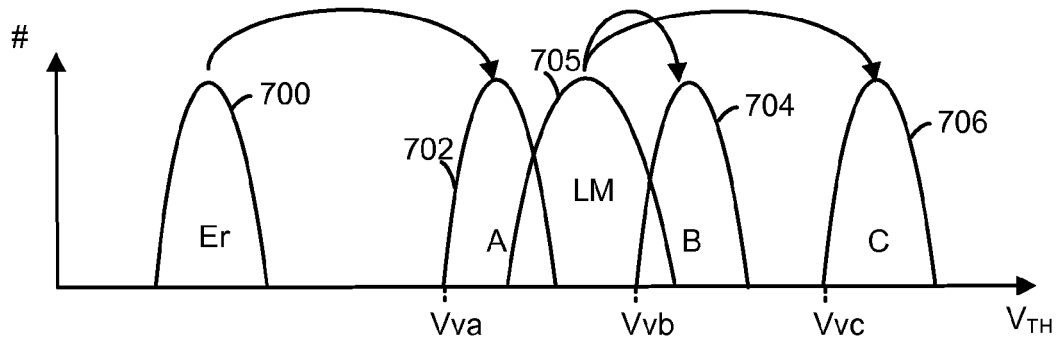

FIGS. 7B and 7C depict a two pass programming sequence in accordance with one embodiment. In the first pass, the lower page is programmed. In the second pass the upper page is programmed. As depicted in FIG. 7B, in the first pass storage elements intended for either the B- or C-states are programmed to an intermediate state 705. The intermediate state 705 has a verify level of VvLM.

As depicted in FIG. 7C, in the second pass programming to the A-, B-, and C-states is completed. Storage elements targeted for the A-state are programmed from the Er-state 700 to the A-state 702. Storage elements targeted for the B-state are programmed from the LM-state 705 to the B-state 704. Storage elements targeted for the C-state are programmed from the LM-state 705 to the C-state 706. In one embodiment, an IDL is performed between the first and second programming pass.

FIGS. 8A-8C depict one embodiment of a three pass programming sequence. The first pass depicted in FIG. 8A programs the lower page. Thus, in the first pass storage elements intended for either the B- or C-states are programmed to an intermediate state 705.

FIG. 8B depicts the second programming pass in which the B- and C-states are programmed. Storage elements targeted for the B-state are programmed from the LM-state 705 to the B-state 704. Storage elements targeted for the C-state are programmed from the LM-state 705 to the C-state 706. However, note that the A-state is not programmed during the second programming pass.

FIG. 8C depicts a third programming pass in which the A-state is programmed. Storage elements targeted for the A-state are programmed from the Er-state 700 to the A-state 702. Thus, note that the A-state programming is not started until the B- and C-states are complete.

In some embodiments, in order to perform the second and third programming passes, an IDL is performed to determine whether memory cells are in the Er- or the LM-state. This, in effect, reads the lower data page.

Figure 9A:
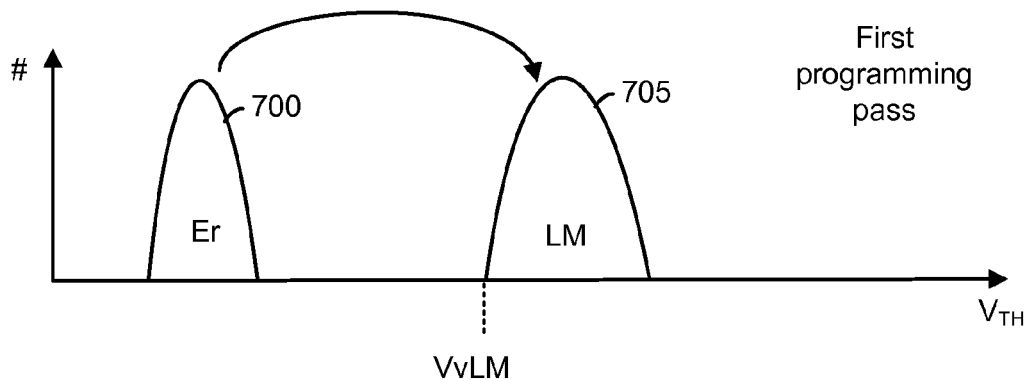
FIGS. 9A, 9B and 9C depict one embodiment of a three pass programming sequence in which the C-state is programmed prior to starting the other states.
Figure 9B:
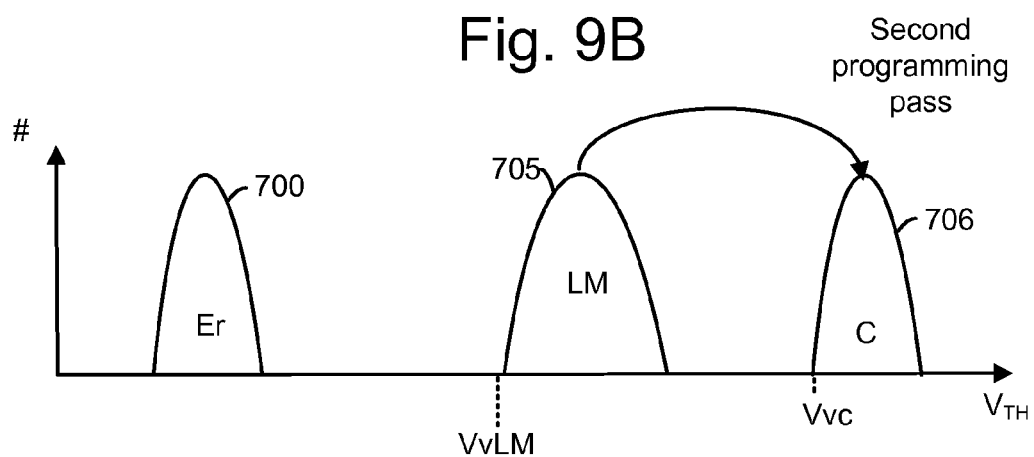
Figure 9C:
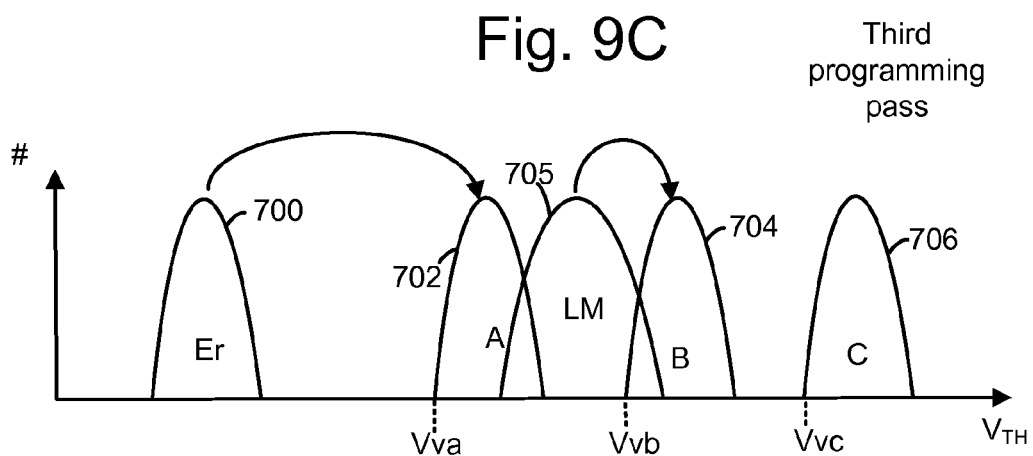

FIGS. 9A, 9B and 9C depict one embodiment of a three pass programming sequence in which the C-state is programmed prior to starting the other states. The first pass depicted in FIG. 9A programs the lower page. Thus, in the first pass storage elements intended for either the B- or C-states are programmed to an intermediate state 705. FIG. 9B depicts the C-state being programmed. Storage elements targeted for the C-state are programmed from the intermediate state 705 to the C-state 706.

FIG. 9C depicts the A- and B-states being programmed. Storage elements targeted for the A-state are programmed from the Er-state 700 to the A-state 702. Storage elements targeted for the B-state are programmed from the intermediate state 705 to the B-state 704.

In some embodiments, in order to perform the second and third programming passes, an internal data read is performed to determine whether memory cells are in the Er- or the LM-state. This, in effect, reads the lower data page.

The following table describes one possible sequence of programming lower pages and upper pages. Other sequences are possible. In general, word lines may be programmed from lower numbered word lines to higher numbers, in this example. This may correspond to programming from the source line towards the bit line (drain side of NAND string).

TABLE I

| WL      | Lower Page | Upper Page |
|---------|------------|------------|
| WLn + 1 | 5          | 8          |
| WLn     | 3          | 6          |
| WLn − 1 | 1          | 4          |

As the above sequence shows, when the upper page of WLn is being programmed, the upper page has already been programmed on WLn−1, but not on WLn+1. At the time the upper page is programmed on WLn, the lower page has already been programmed on both WLn−1 and WLn+1. Thus, when programming the upper page on WLn, one neighbor has had its upper page programmed and the other neighbor has not.

Moreover, note that between the programming of the lower page into WLn and programming the upper page into WLn, the upper page is programmed into WLn−1. As will be discussed below, the programming of the upper page into WLn−1 may impact the apparent Vt of the memory cells on WLn. Hence, reading of the lower page on WLn that takes place just prior to programming the upper page of WLn may be impacted by the programming of the upper page on WLn−1. Also, the reason that numbers 1 and 7 in the sequence are not depicted in Table I is because those pertain to programming of WLn−2 and WLn+2.

In this example, it is the source side neighbor of WLn that has its upper page programmed (and drain side not programmed). However, it is possible to have a programming sequence in which it is the drain side neighbor that has its upper page programmed (and source side not programmed). Techniques are disclosed herein for performing a sensing operation of storage elements that are about to have an upper page programmed therein when the neighbors to one side have an upper page programmed and the neighbors to the other side do not.

Figure 10A:
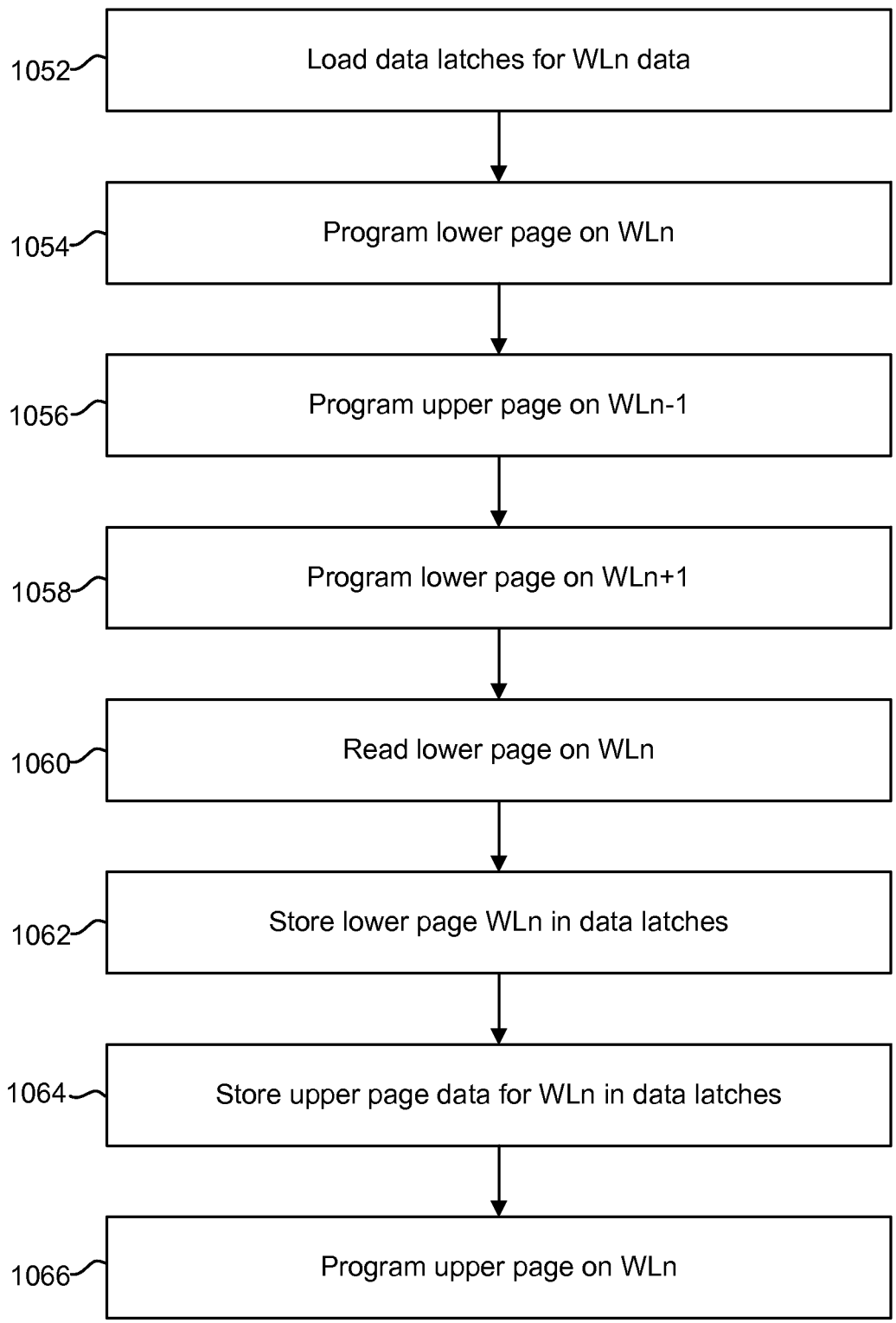
FIG. 10A is a flowchart of one embodiment of a sequence of programming several word lines.

FIG. 10A is a flowchart of one embodiment of a sequence of programming several word lines. This sequence is consistent with the sequence depicted in Table I. Greater details are provided for WLn than for WLn−1 and WLn+1. In particular, greater details of data latch usage is depicted for WLn. FIG. 10A describes programming lower page and upper page data. Programming sequences such as depicted in FIGS. 7A-7C, 8A-8C, and 9A-9C could be used. Also, other programming sequences could be used for the process in FIG. 10A.

In step 1052 data latches are loaded to enable programming lower page data into WLn. Referring to FIG. 5B, lower page data could be provided from the controller 444 and stored in the set of DL1 latches.

In step 1054, lower page data is programmed into WLn. By this it is meant that non-volatile storage elements associated with WLn are programmed with the lower page bit associated with their respective data latch. After step 1054, distributions such as in FIG. 7B are arrived at.

In step 1056, upper page data is programmed into WLn−1. Steps 1060-1066 below describe how upper page data is programmed into WLn. Programming of WLn−1 may be similar.

In step 1058, lower page data is programmed into WLn+1. This may be similar to step 1052. Therefore, lower page data may be provided from the controller 444 and stored in data latches. Then, the data from the latches (e.g., DL1) may be programmed into the memory cells associated with WLn+1.

Steps 1060-1066 describe programming of upper page data into WLn. Since the latches were used in step 1056 to program upper page data into WLn−1, the data latches needed to be freed up. For example, step 1052 may have stored the lower page data for WLn into the DL1 latches. However, the DL1 latches may have been used when programming of WLn−1. Therefore, the lower page data of WLn that was stored in the latches in step 1052 may have been overwritten. In step 1060, the lower page data is sensed from the storage elements associated with WLn.

In step 1062, the lower page data is stored into the data latches. For example, the lower page data may be stored into the set of DL1 latches. This may be referred to as an "Internal Data Load" (IDL). Note that this does not require that any data be transferred from or to the controller 444. For example, the controller 444 need not provide the lower page data again. Also, the lower page data does not need to be sent to the controller 444 for error correction.

In step 1064, the upper page data for WLn is stored in data latches. This upper page data may be provided by the controller 444. The upper page data could be stored in the set of DL2 latches. Note that step 1064 could be performed prior to step 1060.

In step 1066, the upper page data is programmed into WLn. By this it is meant the non-volatile storage elements associate with WLn are each programmed with one bit of the upper page. When programming the upper page, the DL1 latches may store lower page data, the DL2 latches may store upper page data, and the DL3 latches may be used for verify status. However, other latch assignments could be used.

In one embodiment, step 1066 involves a second programming pass such as depicted in FIG. 7C. In one embodiment step 1066 involves a technique such as depicted in FIGS. 8B and 8C. In one embodiment step 1066 involves a technique such as depicted in FIGS. 9B and 9C. However, different techniques could be used.

When programming a NAND string of non-volatile storage elements, the conductivity of the NAND string may change as programming progresses. Programming memory cells may add electrons to the floating gate, which may lower the voltage of the floating gate. It is possible for the NAND string to become less conductive after storage elements are programmed. This may be due to the added electrons on the floating gate. This decrease in conductivity may affect the reading of storage elements. One possibility is for the threshold voltage memory cells on a given word line to appear to be higher after neighbor word lines are programmed.

FIG. 10B will be used to discuss a possible shift in the distribution of threshold voltages due at least in part to this NAND string conductivity effect. Distribution 1002 and distribution 1004 are two threshold distributions for two states immediately after the target WL is programmed. Distribution 1002 could be the Er-state and distribution 1004 could be the LM-state. The assignment of "1" and "0" could be switched. In this example, there is actually some overlap between curves 1002, 1004 even immediately after programming. However, even if there is no overlap (and even if there is considerable margin), problems can still develop. Note that as memory devices continue to scale down in size, there may be a trend of less margin between states. Also, as a memory device undergoes additional program/erase cycles, the stress that the memory device undergoes can decrease the read margins.

Distribution 1012 represents a shift in the apparent threshold voltage of storage elements that were originally represented by distribution 1002. This is the shift after an upper page on a neighboring word line has been programmed. This shift is more than what would be expected from capacitive coupling effect of the neighboring word line due to its potential changes as a result of upper page programming. As discussed above, the NAND string conductivity may decrease when the neighbor memory cell is programmed. The reduction of conductivity may be more pronounced when trying to read the target WL with a lower read reference voltage (hence lower gate voltage override), which is the case when IDL read is performed. This decrease in conductivity may make it appear that the threshold voltages on the target word line have increased.

Note that there is now some overlap between distribution 1012 and distribution 1004. Note that distribution 1004 may also shift, although to simplify discussion that shift is not depicted. The IDL read level is a reference voltage that is used to distinguish between the two states in FIG. 10B. Memory cells in the shaded region 1015 of distribution 1012 are those that should have been read as a "1" but were read as a "0". Note that the distributions are on a log scale, which may appear to accentuate how many memory cells may in fact be in the shaded region. Note that in one embodiment no error correction is performed to attempt to correct for these misreads. Rather, this read of the IDL read level may be an "internal data load" in which memory cells are sensed and the result stored in a data latch on the memory die. However, the data (and associated ECC) are not sent off chip to a controller 444 to perform error correction to attempt to correct misreads.

FIG. 10C shows four threshold distributions after programming an upper page based on reading distribution 1012 and 1004 without attempting to correct misreads. Storage elements in distribution 1022 store a "1" for both the lower and upper page. Storage elements in distribution 1024 store a "1" for the lower page and a "0" for the lower page. Storage elements in distribution 1026 store a "0" for both the upper page and the lower page. Storage elements in distribution 1028 store a "0" for the lower page and a "1" for the upper page.

Distributions 1036 and 1038 represent storage elements that were mis-programmed. Distribution 1036 represents storage elements that should have been programmed to "10", but were mis-programmed to "00" because they were misread as previously discussed. These may be referred to as A->B fails. Distribution 1038 represents storage elements that should have been programmed to "11", but were mis-programmed to "01" because they were misread as previously discussed. These may be referred to as E->A fails (or Er->A fails).

Figure 11A:
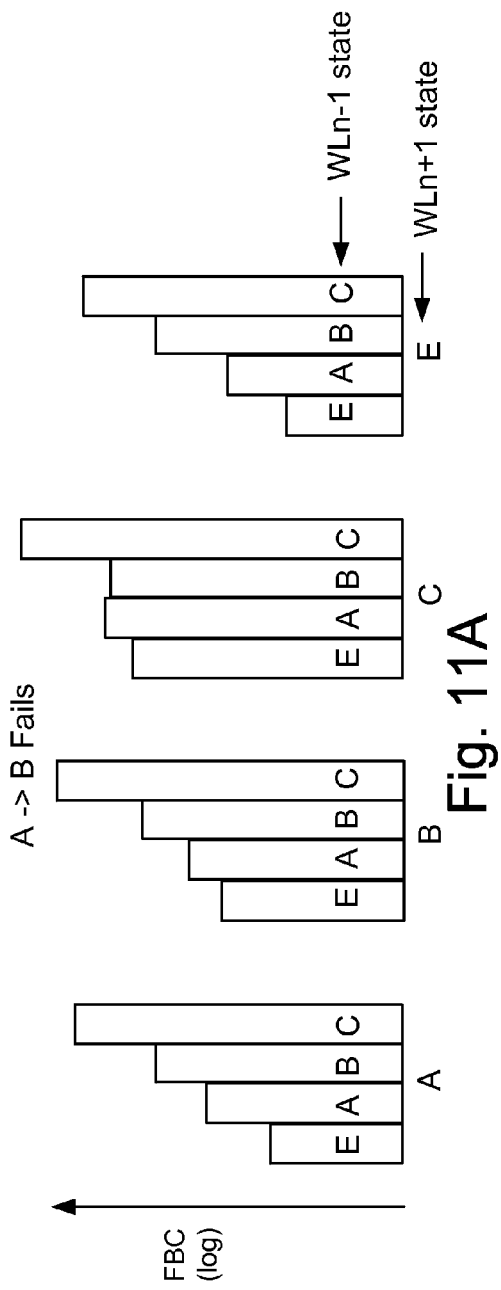
FIG. 11A shows fail bit counts (FBC) for A->B fails on WLn as a function of the data state of both WLn-1 and WLn+1.
Figure 11B:
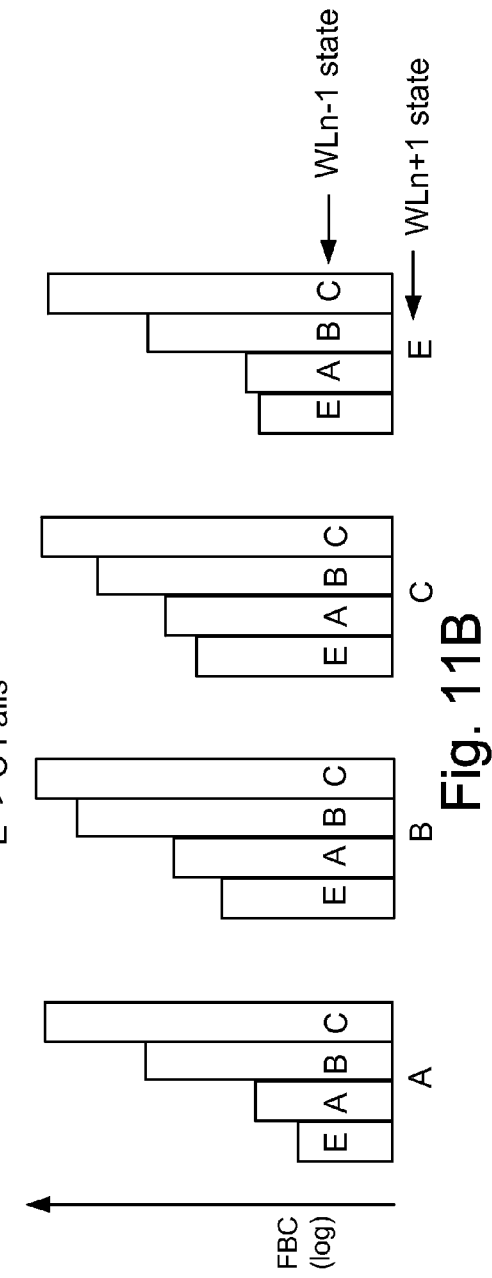
FIG. 11B shows fail bit counts FBC for E->C fails on a log scale for memory cells on WLn as a function of the data state of both WLn-1 and WLn+1.

FIG. 11A and FIG. 11B each show fail bit counts (FBC) on a log scale for memory cells on WLn as a function of the data state of both WLn−1 and WLn+1. FIG. 11A shows FBC for A->B fails. FIG. 11B shows FBC for E->C fails. Here, "E" refers to the erase state. For each case, the FBC is much higher when WLn−1 is in the C-state (note that this is a log scale). Also, the FBC does not depend as strongly on the state of memory cells on WLn+1 as it does on the state of memory cells on WLn−1. This may be due to the fact that the upper page of WL+1 is not yet programmed when the upper page of WLn is programmed. In other words, the upper page of WL+1 is not programmed between the time that the lower page of WLn was programmed and when it was read back in the IDL.

However, the upper page of WLn−1 is programmed when the upper page of WLn is programmed. In other words, the upper page of WL−1 is programmed between the time that the lower page of WLn was programmed and when it was read back in the IDL. Thus, when reading back the lower page data from memory cells on WLn, this IDL is impacted more by the memory cells on WLn−1 than by the memory cells on WLn+1. This is under the assumption that programming has a sequence such as described in Table I. If a different sequence is used, then the reverse could be true. For example, if memory cells are programmed from drain to source (instead of source to drain), then the reverse might be true.

The mis-programmed storage elements typically cannot be correctly read back by shifting read levels. For example, sometimes misreads can be corrected by simply shifting the read level. However, that typically will not work to correct these mis-programs.

Some error correction algorithms may be able to correct for at least some mis-programmed storage elements. For example, after applying error correction, a storage element that was mis-programmed to the "00" distribution may be correctly read as being at the "10" state. Likewise, after applying error correction, a storage element that was mis-programmed to the "01" distribution may be correctly read as being at the "11" state. However, there may be a limit as to how many mis-programmed storage elements can be corrected. Also, not all error correction algorithms are able to correct such mis-programmed storage elements. An error that cannot be corrected by shifting read levels or by applying error correction may be referred to as a "hard error."

Figure 12:
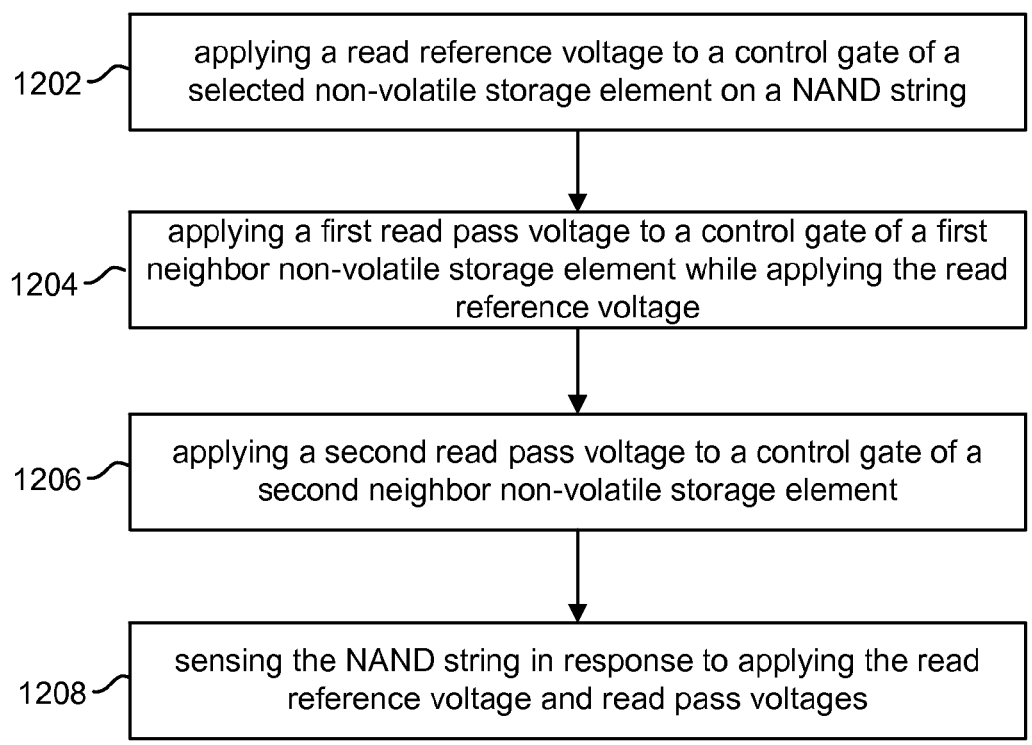
FIG. 12 is a flowchart of one embodiment of a process of sensing a NAND string having non-volatile storage elements.

FIG. 12 is a flowchart of one embodiment of a process of sensing a NAND string having non-volatile storage elements. This read process is used for a sensing operation other than an IDL, in one embodiment. A selected non-volatile storage element is being sensed in this process. The selected non-volatile storage element is associated with a selected word line. Other non-volatile storage elements associated with the selected word line may be sensed at the same time.

The selected non-volatile storage element has two neighbor non-volatile storage elements. One neighbor is towards the drain side of the NAND string and the other towards the source side. The sensing operation may be performed as part of a read operation when an upper page bit is programmed in both neighbors. For example, it may be used when reading after programming of both neighbor word lines is complete.

FIG. 3 shows one example of voltages applied during one embodiment of the process of FIG. 12. Memory cell 316, which is on WL4, is the selected memory cell. This cell has Vcgrv applied to its control gate. Referring to FIG. 7A, Vcgrv could be Vra, Vrb, Vrc, for example. In this example, Vread_S1 is applied to memory cell 314 and Vread_D1 is applied to memory cell 318. Other unselected memory cells have Vread applied to their control gates.

In step 1202, a read reference voltage (e.g., Vcgrv) is applied to a control gate of the selected non-volatile storage element on the NAND string. This may include applying the read reference voltage to a selected word line (e.g., WL4).

In step 1204, a first read pass voltage (e.g., Vread_S1) is applied to a control gate of a first of the neighbor non-volatile storage elements (e.g., 314) while applying the read reference voltage. For sake of discussion, this will be the source side neighbor. Step 1204 may include applying the read reference voltage to a first unselected word line (e.g., WL3).

In step 1206, a second read pass voltage (e.g., Vread_D1) is applied to a control gate of a second neighbor non-volatile element (e.g., 318) while applying the read reference voltage. Step 1204 may include applying the read reference voltage to a second unselected word line (e.g., WL5). For sake of discussion, this will be the drain side neighbor. The magnitude of the first and second read pass voltages may be different from one another.

Read pass voltages (e.g., Vread) may also be applied to all other unselected word lines. In one embodiment, Vread_S1 is greater than Vread. In one embodiment, Vread_D1 is greater than Vread. In one embodiment, Vread_S1 and Vread_D1 are about the same. In one embodiment, Vread_S1 is greater than Vread_D. In one embodiment, Vread_S1 is less than Vread_D1.

In step 1208, the NAND string is sensed in response to applying the read reference voltage to the control gate of the selected memory cell and the read pass voltages to the control gates of the unselected memory cells. The results of sensing the memory cell may be stored in a data latch.

The process of FIG. 12 may be repeated several times to arrive at the data state of the selected memory cell. For example, reading could be performed at different read reference voltages, such as Vra, Vrb, Vrc, for example. Also note that when reading the selected memory cell, other memory cells associated with other NAND strings may be read.

In one embodiment, the read pass voltages that are applied to the two neighbor word lines of the selected word line are adjusted to result in a more accurate IDL. By the two neighbors it is meant the neighbors on each side of the selected word line. The read pass voltage for one neighbor WL may be increased by some delta voltage, whereas the read pass voltage for the other neighbor WL may be decreased by the same delta voltage. By increasing one read pass voltage and decreasing the other, the neutral Vt of the selected memory cells is not impacted. Moreover, the increased read pass voltage on the one neighbor WL can help improve read accuracy, whereas the decreased read pass voltage on the other neighbor WL does not hurt read accuracy.

Figure 13:
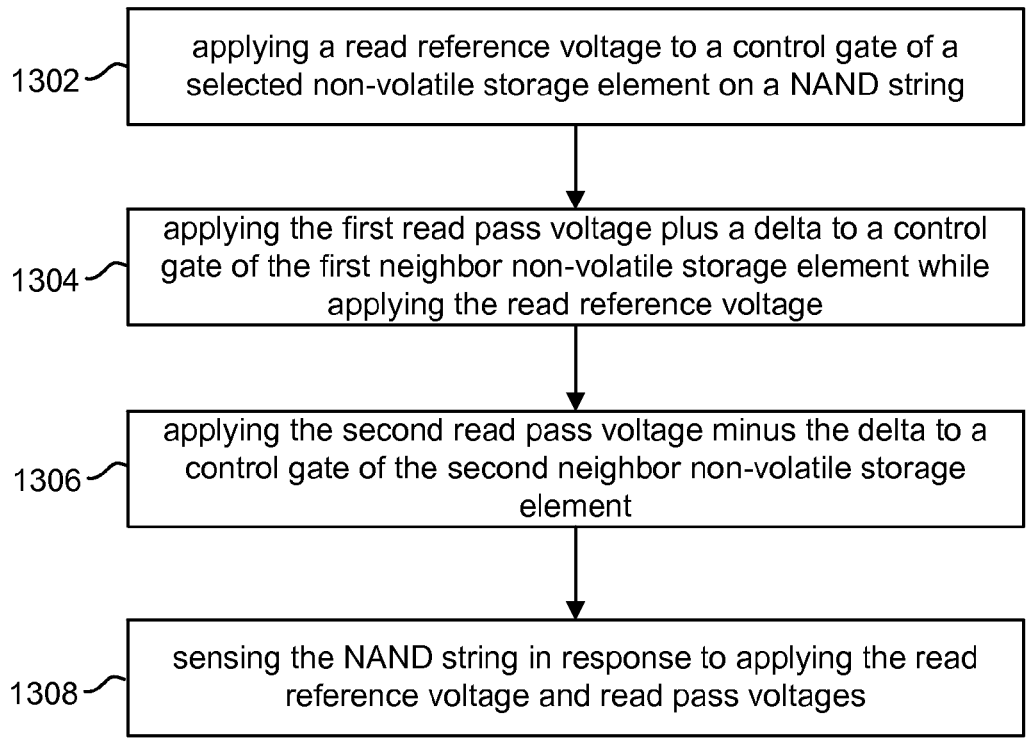
FIG. 13 is a flowchart of one embodiment of a process of sensing a NAND string having non-volatile storage elements.

FIG. 13 is a flowchart of one embodiment of a process of sensing a NAND string having non-volatile storage elements. In one embodiment, this process is used during an IDL. The process may be used during step 1060 of the process of FIG. 10A. Thus, prior to this process, a lower page may be programmed into the selected word line (e.g., step 1054, FIG. 10A) and an upper page may be programmed into one of the neighbor word lines (e.g., step 1056, FIG. 10A).

This process has a read pass voltage for one neighbor WL that is increased by some delta voltage, whereas the read pass voltage for the other neighbor WL is decreased by the same delta voltage. The sensing operation may be performed as a part of a programming operation that programs multiple bits into storage elements. The selected non-volatile storage element may have a first neighbor non-volatile storage element on the NAND string that has an upper page bit programmed and a second neighbor non-volatile storage element on the NAND string that does not have an upper page bit programmed. The first neighbor may have been programmed after the lower page bit was programmed into the selected non-volatile storage element. The neighbor that has the upper page bit programmed could be on either the source side or on the drain side. In one embodiment, the neighbor that has the upper page bit programmed is on the source side and the neighbor that does not have the upper page bit programmed is on the drain side. The process of FIG. 13 describes sensing a selected non-volatile storage element after programming an upper page bit into the first neighbor and prior to programming an upper page bit into the second neighbor.

Figure 14:
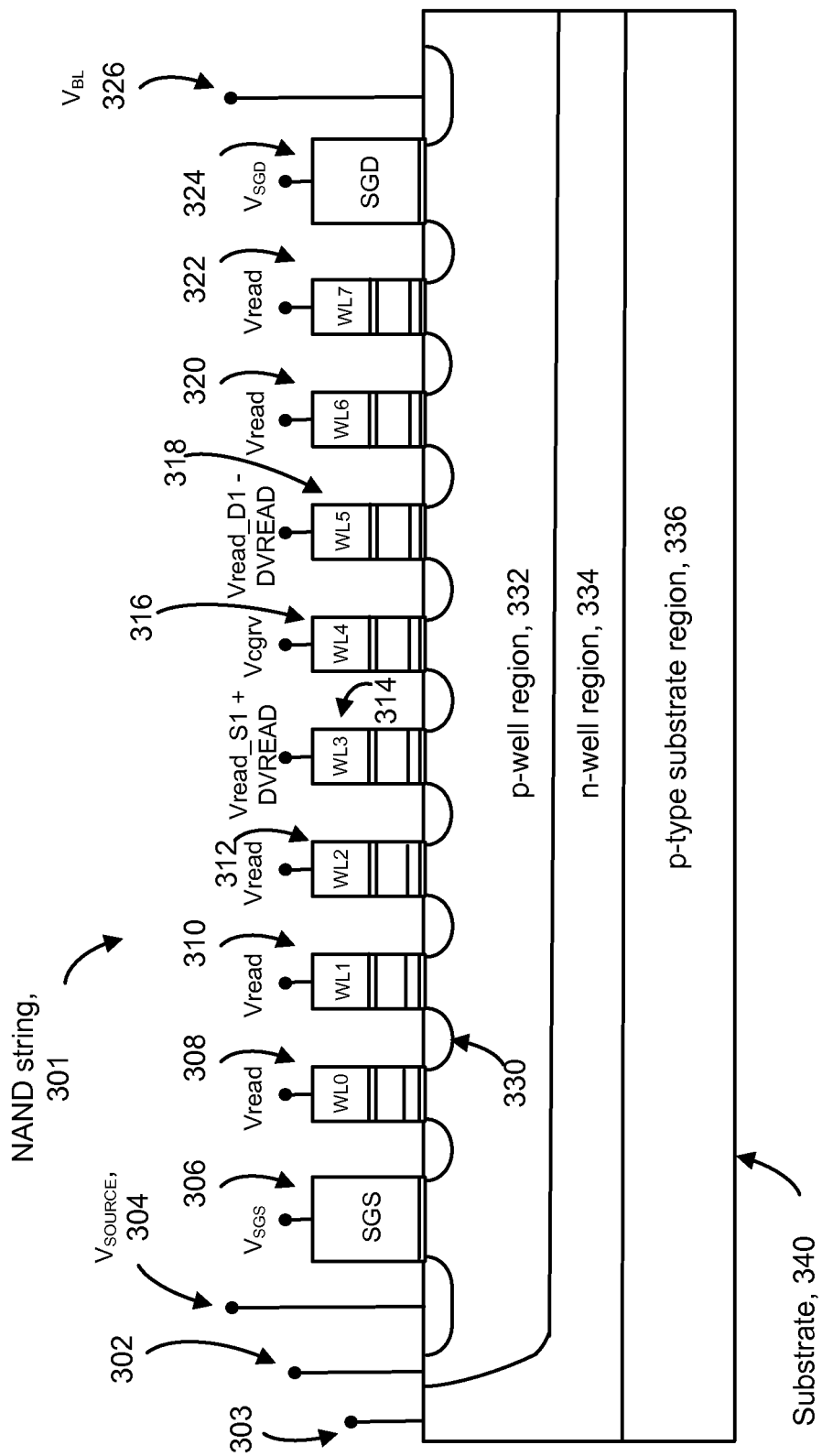
FIG. 14 shows one example of voltages applied during one embodiment of the process of FIG. 13.

FIG. 14 shows one example of voltages applied during one embodiment of the process of FIG. 13. Memory cell 316, which is on WL4, is the selected memory cell. This cell has Vcgrv applied to its control gate. In this example Vread_S1+DVREAD is applied to memory cell 314 and Vread_D1−DVREAD is applied to memory cell 318. Other unselected memory cells have Vread applied to their control gates. The voltages Vread_S1 and Vread_D1 may be the same as those used in the process of FIG. 12.

The process of FIG. 13 applies read reference voltages to the neighbor non-volatile storage element that are different from those applied during a read in which both neighbors have an upper page bit programmed. For the sake of discussion, the "first read pass voltage" that will be referred to in FIG. 13 is the same as the one referred to in FIG. 12. Likewise, for the sake of discussion, the "second read pass voltage" that will be referred to in FIG. 13 is the same as the one referred to in FIG. 12.

In step 1302, a read reference voltage (e.g., Vcgrv) is applied to a control gate of a selected non-volatile storage element (e.g., memory cell 316). Step 1302 may include applying the read reference voltage to a selected word line. In one embodiment, the first neighbor word line has an upper page programmed, whereas the second neighbor word line does not have the upper page programmed. Referring to FIG. 7B, Vcgrv could be Vra1, for example. This process may be used to read memory cells after a lower page has been stored in them. Therefore, memory cells may have a threshold distribution such as in the example of FIG. 7B.

In step 1304, the first read pass voltage plus a delta voltage (e.g., Vread_S1+DVREAD) is applied to a control gate of a first of the neighbor non-volatile storage elements (e.g., memory cell 314) while applying the read reference voltage. Step 1304 may include applying the first read pass voltage plus a delta voltage to an unselected word line (e.g., WL3) that neighbors the selected word line. In the example of FIG. 13B, the delta increase is applied to the neighbor on the source side. However, the neighbor cell drain side of the NAND string could receive the delta increase.

In step 1306, the second read pass voltage minus the delta voltage (e.g., Vread_D1−DVREAD) is applied to a control gate of a second neighbor non-volatile element (e.g., memory cell 318) while applying the read reference voltage. Step 1306 may include applying the first read pass voltage minus the delta voltage to an unselected word line (e.g., WL5) that neighbors the selected word line. Note that the neighbor word line in step 1306 may be on the opposite side of the selected word line as the neighbor word line in step 1304. In the example of FIG. 14, the delta voltage decrease is applied to the neighbor on the drain side. However, the neighbor cell on the source side of the NAND string could receive the delta decrease. This may be the case if the programming sequence is different, such that the drain side neighbor upper page is programmed after programming the lower page of the selected word line, but the source side upper page is not.

The delta (e.g., DVREAD) is some voltage increment. Moreover, this increment has the same absolute magnitude in step 1304 as it does on step 1306, for one embodiment. However, the delta voltage is added to the read pass voltage for the neighbor on one side and subtracted from the read pass voltage for the neighbor on the other side. This may tend to balance out the read pass voltages being applied to the neighbor memory cells. As will be discussed further below, this may balance out the impact that the neighbor read pass voltages have on the floating gate of the selected memory cells.

In one embodiment, Vread_S1 and Vread_D1 are about the same. In one embodiment, Vread_S1 is greater than Vread_D1. In one embodiment, Vread_S1 is less than Vread_D1. In one embodiment, the first read pass voltage plus the delta voltage (e.g., Vread_S1+DVREAD) is greater than the second read pass voltage minus the delta voltage (e.g., Vread_D1−DVREAD).

Read pass voltages (e.g., Vread) may also be applied to all other unselected word lines. In one embodiment, Vread_S1 is greater than Vread. In one embodiment, Vread_D1 is greater than Vread. In one embodiment, the first read pass voltage plus the delta voltage (e.g., Vread_S1+DVREAD) is greater than the read pass voltages (e.g., Vread) applied to the other unselected word lines. In one embodiment, the second read pass voltage minus the delta voltage (e.g., Vread_D1−DVREAD) is greater than the read pass voltages (e.g., Vread) applied to the other unselected word lines. In one embodiment, the second read pass voltage minus the delta voltage (e.g., Vread_D1−DVREAD) is about the same as the read pass voltages (e.g., Vread) applied to the other unselected word lines.

In step 1308, the NAND string is sensed while applying the read reference voltage, as well as the read pass voltages from steps 1304 and 1306, as well as the read pass voltages to other unselected word lines. In one embodiment, results of the sensing operation are stored in a data latch associated with the NAND string. In one embodiment, the data is not sent off chip to perform ECC. Thus, this sensing operation is typically faster than one in which data is sent off chip to perform ECC. It typically is also faster than a read operation in which ECC is performed on chip.

As noted, the process of FIG. 13 may be used for the sensing step (step 1060) of the process of FIG. 10A. Therefore, the data that is sensed in step 1308 may be stored in a data latch and used when programming an upper page bit in the selected memory cell. Thus, steps 1062-1066 may follow the process of FIG. 13. Also, as noted, one of the neighbors may have its upper page bit programmed after to the selected memory cell, and the other neighbor may have its upper page bit programmed after the selected memory cell.

The following is a brief explanation of coupling effects that may take place during one embodiment of the sensing process of FIG. 13.

$$V_{FG}=[(Vread\_S1+DVREAD)*CR+(Vread\_D1-DVREAD)*CR)]$$  Eq. 1

Equation 1 refers to the potential on the floating gate of the selected memory cell ($V_{FG}$), which may result due to the read pass voltages applied to control gates of neighbor memory cells (some other terms in this equation are ignored to simplify the discussion here). This effect may be due to capacitive coupling between the neighbor control gates and the floating gate of the selected memory cell. The term "CR" refers to the coupling ratio for the capacitive coupling between two neighboring word lines. The first term on the right is the effect of capacitive coupling from the neighbor on the source side. Vread_S1+DVREAD is the read pass voltage applied to the source side neighbor word line. The second term on the right is the effect of capacitive coupling from the neighbor on the drain side. Vread_D1−DVREAD is the read pass voltage applied to the drain side neighbor word line.

Increasing the read pass voltage on the neighbor WL on the source side may help the read process when the neighbor WL on the source side has already been programmed with an upper page. This may be at least in part due to the source side neighbor WL having its upper page programmed after the lower page was programmed into the selected WL, but prior to the IDL of the lower page data from the selected WL, in one embodiment.

However, the neighbor WL on the drain side has not yet been programmed with an upper page. In other words, the drain side neighbor WL did not have its upper page programmed between the time that the lower page was programmed in the selected WL and the IDL was used to read back the lower page from the selected WL. Therefore, increasing the read pass voltage for that neighbor WL may not be needed. Moreover, reducing the read pass voltage on the drain side neighbor WL by the same amount as the increase in the read pass voltage on the source side neighbor WL means that the net coupling effect is about the same (compared to no deltas). This helps to maintain a neutral Vt for the target memory cells on the selected WL. In other words, if the read pass voltage on the source side WL were to be increased without a similar (but opposite) change to the read pass voltage on the drain side WL, then the neutral Vt of the target memory cells may be impacted.

In one embodiment, a read reference voltage is adjusted based on data in one of the neighbor non-volatile storage elements. This adjustment may be made when one of the neighbors has an upper page bit programmed and the other does not. Stated another way, this may be performed when an upper page is programmed on one neighbor word line but not on the other. In one embodiment, this is the source side neighbor memory cell (or source side word line).

Figure 15:
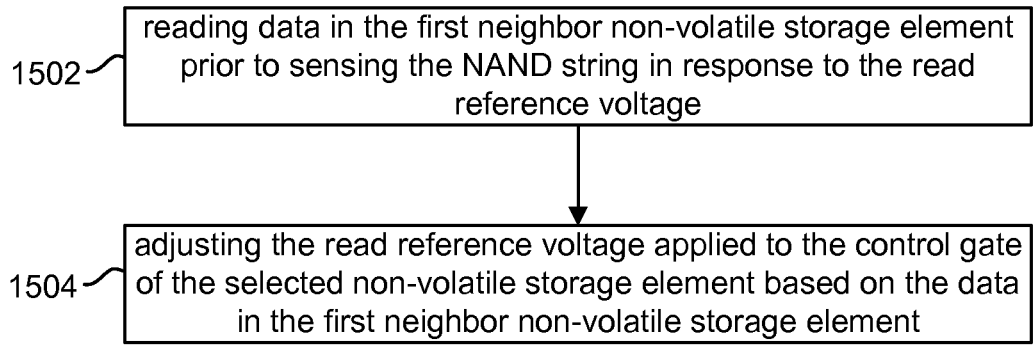
FIG. 15 is a flowchart of one embodiment of a process of adjusted a read reference voltage.

FIG. 15 is a flowchart of one embodiment of a process of adjusting a read reference voltage. This process can be used in connection with the process of FIG. 13. For example, this process may be used to determine a read reference voltage (e.g., Vcgrv) for step 1302 of FIG. 13.

In step 1502, data is read from a neighbor non-volatile storage element to the selected non-volatile storage element. Again, the selected non-volatile storage element refers to the one to be read in an IDL process such as the one of FIG. 13. The neighbor non-volatile storage element that is read in step 1502 already has had its upper page bit programmed. Note that this programming of the upper page bit may have occurred after the lower page bit was programmed in the selected memory cell. The neighbor is the source side neighbor, in one embodiment. However, it could be the drain side neighbor instead. Note that the other neighbor has not yet had its upper page bit programmed in this process, in one embodiment. In one embodiment, the neighbor did not have its upper page bit programmed after the lower page bit was programmed into the selected memory cell. Step 1502 may include reading data from each of a group of selected non-volatile storage elements associated with a selected word line.

Figure 16A:
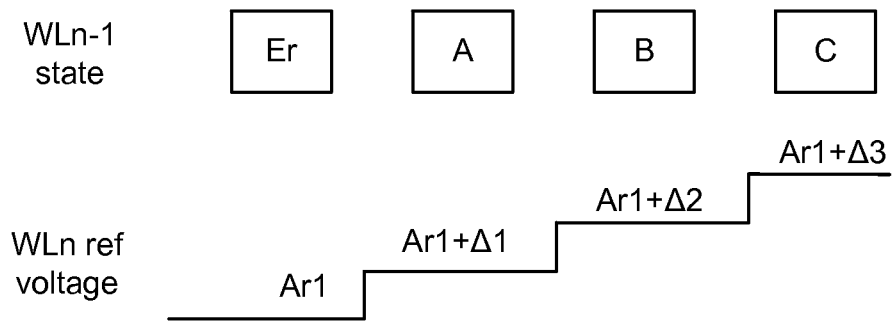
FIG. 16A is a diagram showing one embodiment of adjustments made to a read reference voltage.
Figure 16B:
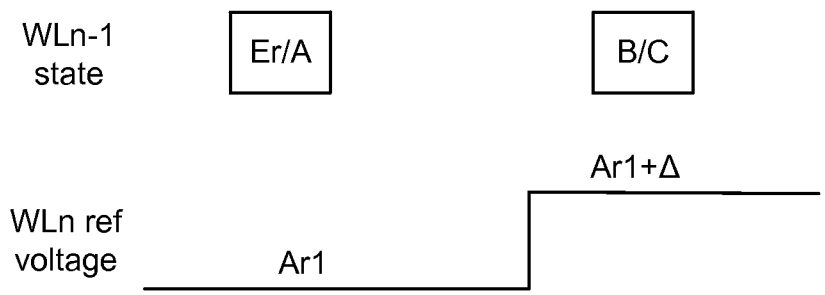
FIG. 16B is a diagram showing another embodiment of adjustments made to a read reference voltage.

In step 1504, a read reference voltage is adjusted based on the data that was stored in the neighbor non-volatile storage element. Note that since the upper page bit was already programmed in the neighbor, the read could distinguish between four states (e.g., Er, A, B, C). One possibility for the adjustment is depicted in FIG. 16A. FIG. 16A shows an example in which the reference voltage is "Ar1" when the neighbor is in the "Er" state, "Ar1+Δ1" when the neighbor is in the A state, etc. Another possibility is to use only two different read reference voltages, as depicted in FIG. 16B. FIG. 16B shows an example in which the reference voltage is "Ar1" when the neighbor is in either the "Er" state or the A state and "Ar1+Δ" when the neighbor is in either the B state or the C state. In this case, reading of the neighbor memory cell can be simplified in that only one sensing operation is needed.

Note that in the examples of FIGS. 16A and 16B the neighbor from which the data is read to make the adjustment is WLn–1 and the selected memory cell is on WLn. This may be suitable for situations in which WLn–1 has its upper page programmed after the lower page of WLn, but prior to programming the upper page on WLn. However, if the reverse is true (e.g., WLn has its upper page programmed after the lower page of WLn–1 but prior to the upper page of WLn–1) then WLn may be read to provide the data for adjusting the read reference voltage when reading WLn–1. Applying the adjustment to the read reference data can help reduce or eliminate read errors during a sensing operation such as an IDL.

As noted herein, there can be a problem of lower page data stored in target memory cells being impacted by later programming of upper page data in neighbor memory cells. For example, the apparent Vt of the target memory cells can be impacted by the later programming of the upper page data. In some embodiments, the lower page data is read from target memory cells prior to upper page data being programmed in neighbors. In some embodiments, upper page data is not programmed into a neighbor word line between the time that the lower page data is programmed into the target word line and the time the IDL is performed to read back the lower page data from the target word line. Therefore, the IDL may result in cleaner data.

Figure 17:
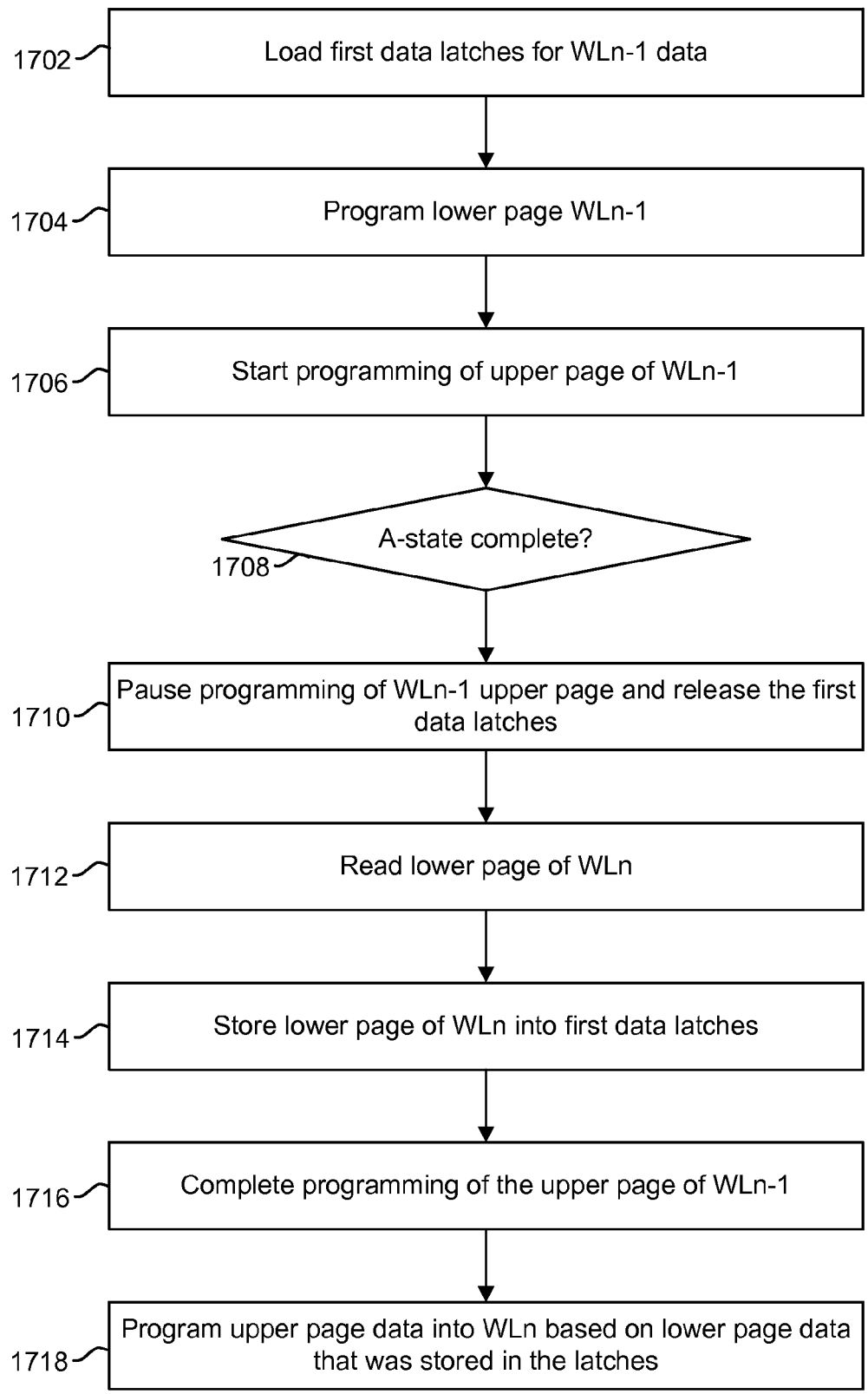
FIG. 17 is a flowchart of one embodiment of a process of programming non-volatile storage elements.

FIG. 17 is a flowchart of one embodiment of a process of pausing programming of a neighbor word line prior to completion of upper page programming, such that lower page data from target memory cells may be read into data latches. This preserves the lower page data of the target memory cells in the data latches while upper page programming of the neighbor completes. Therefore, the lower page data of the target memory cells is cleaner when it comes time to program the upper page into the target memory cells.

In step 1702, data latches are loaded to set up programming of a lower page on the neighbor word line. These could be the DL1 latches, for example. For the sake of discussion WLn–1 will be referred to as the neighbor word line, and WLn as the target word line. This is consistent with the programming sequence of Table I. However, the neighbor could be WLn+1 if another programming sequence is used.

In step 1704, lower page data is programmed into the neighbor word line (e.g., WLn–1). This programming may use the data stored in the first data latches.

In step 1706, programming of the upper page of WLn–1 is started. Note that the DL2 latches may have been written to in order to hold the upper page data. Note also that a different word line could be programmed between step 1704 and 1706. However, that programming is not described so as to not complicate the discussion. Step 1706 may be referred to as starting to program a first upper page into a first group of non-volatile storage elements associated with a first word line. The first group of non-volatile storage elements are to be programmed to a plurality of data states.

In step 1708, a determination is made whether programming of a first state (e.g., the A-state) is complete. A first state does not necessarily mean the first state in a sequence. The first state refers may refer to any of the programmed states. When programming of the first state is complete the process continues on to step 1710. Note that when this first state (e.g., A-state) is done programming other states (e.g., the B and C states) may still be programming.

In step 1710, programming of the upper page into the neighbor word line (e.g., WLn–1) is paused. Also, one of the sets of data latches are released. Note that in one embodiment, there are three data latches per NAND string. For example, there are latches DL1, DL2, and DL3. One possible use of these three latches is using DL1 for lower page data, DL2 for upper page data, and DL3 for verify (or lockout) status during programming. A different assignment may be used. Also, the assignment can be changed depending on the stage of programming. In one embodiment, the latches that were used for lower page data (e.g., DL1) are freed in step 1710. However, another set of latches such as those used for verify status (e.g., DL3) may be freed. Since the upper page data will be needed later to complete programming, it may be desirable to not free these latches (e.g., DL2), but rather to maintain the upper page data of WLn–1 in these latches.

In step 1712, lower page data is read from the target word line (e.g., WLn). This may be referred to as reading a lower page of data from a second group of non-volatile storage elements associated with a second word line after the first state has been programmed. The second word line is adjacent to the first word line.

In step 1714, lower page data for the target word line (e.g., WLn) is stored in the data latches that were freed up in step 1710 (e.g., DL1). Thus, steps 1712-1714 may be referred to as an IDL.

In step 1716, programming of the upper page of the neighbor word line (e.g., WLn–1) is completed. This programming may use the upper page data that was preserved in the second set of data latches (e.g., DL2). Note that the lower page data for WLn–1 is not needed because the A-state has been completed.

During step 1716, the lower page data for WLn is preserved in some set of data latches (e.g., DL1). Note that during step 1716 it may be that only two data latches are needed. This is because the A-state has already been programmed. Thus, one possible use of the latches during step 1716 is preserving lower page data for WLn in DL1, storing upper page data for WLn−1 in DL1, and using DL2 for verify status. Other assignments are possible for the three sets of latches.

In step 1718, upper page data is programmed into the target word line (e.g., WLn) based on the lower page data that was preserved into the set of data latches in step 1714. This may provide for cleaner lower page data when programming the upper page. During step 1718 one possible use of the data latches is using DL1 for lower page data for WLn and DL3 for verify status. Other assignments are possible.

Figure 18A:
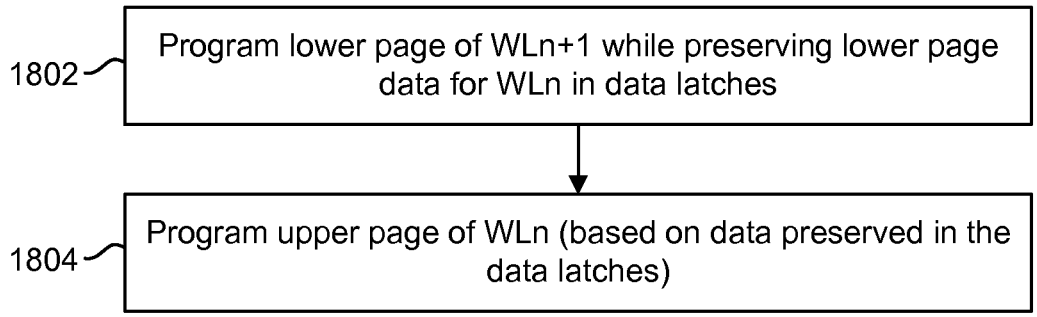
FIG. 18A is one embodiment for performing portions of the process of FIG. 17.

Step 1718 may be performed in more than one way. In one embodiment, the lower page data for WLn is preserved in data latches while lower page data on WLn+1 is programmed. Then, the upper page of WLn is programmed, making use of the lower page data in the latched. FIG. 18A is a flowchart of one embodiment of such a process. Note that programming the lower page of WLn+1 prior to the upper page of WLn is consistent with the sequence of Table I. However, a different sequence could be used.

In step 1802, lower page of the neighbor word line on the other side of the target (e.g., WLn+1) is programmed. Note that lower page of data for WLn is preserved in a set of latches while programming the lower page of data in WLn+1. One possible way to use the latches during step 1802 is as follows. The DL1 latches may be used to preserve the lower page data for WLn. The DL2 latches may be used to store lower page data for WLn+1. The DL3 latches may be used for verify status when programming the lower page into WLn+1.

However, another latch assignment may be used. Since, the set of DL1 latches is typically used to hold lower page data that is presently being programmed, it may simpler to temporarily move the lower page data of WLn from the DL1 latches to the DL2 latches. Then, the DL1 latches may be used to store lower page data for WLn+1.

In one embodiment, the lower page data for WLn+1 is transferred from the controller 444 to a set of the data latches, in step 1802, such that it is available for programming WLn+1.

In step 1804, the upper page of WLn is programmed based on the data that was preserved in the data latches. One possible use of the data latches during step 1804 is as follows. The DL1 latches hold lower page data for WLn. The DL2 latches hole upper page data for WLn. Note that this may be transferred from the controller 444. The DL3 latches may be used for verify status.

Note that an IDL does not need to be performed to access the lower page data of WLn again, in step 1804. Therefore, the lower page data that is in the latches may be cleaner data than might have been obtained had the IDL been performed after completing programming of the upper page into WLn−1.

Figure 18B:
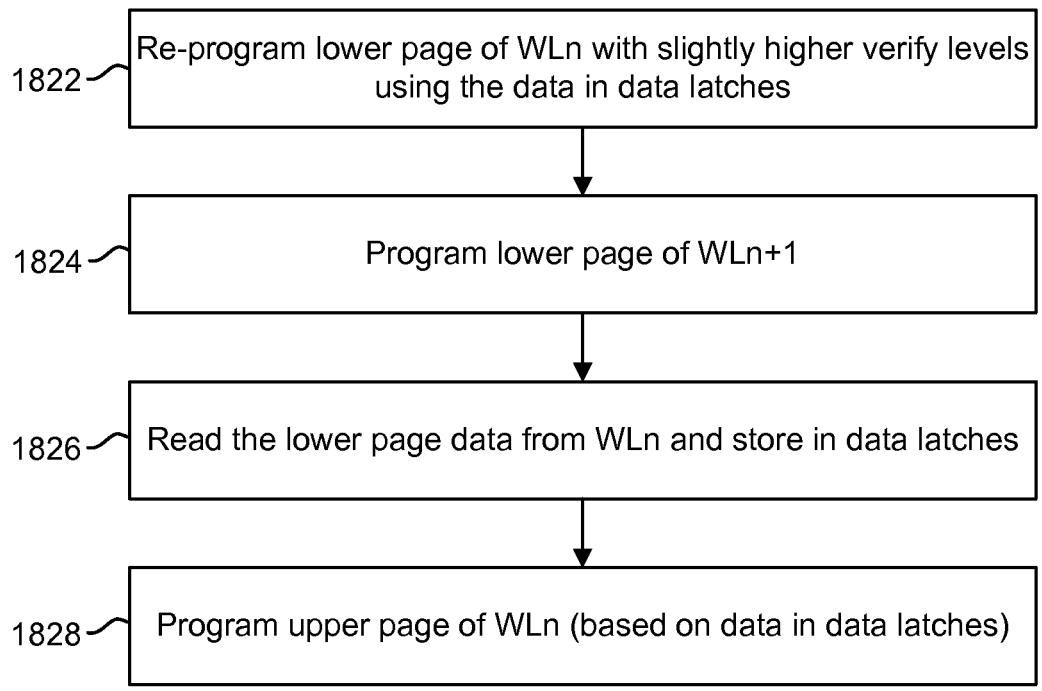
FIG. 18B is another embodiment for performing portions of the process of FIG. 17.

In one embodiment, the lower page data is re-programmed into WLn after the upper page was programmed into WLn−1. Therefore, the lower page data may be cleaner, since it is not impacted by the programming of the upper page into WLn−1. FIG. 18B is one such embodiment. In step 1822, the lower page of WLn is "re-programmed" using the data in the latches. Note that this data is not impacted by the programming of the upper page into WLn−1. Therefore, this "re-programmed" data may be cleaner than if no re-programming was performed. In one embodiment, slightly higher verify levels are used for this "re-programming." One possible use of the data latches during step 1822 is as follows. The DL1 latches hold lower page data for WLn. The DL3 latches may be used for verify status. However, a different latch assignment may be used.

In step 1824, lower page data is programmed into WLn+1. One possible use of the data latches during step 1824 is as follows. The DL1 latches hold lower page data for WLn+1. This lower page data may be transferred from the controller 444. The DL3 latches may be used for verify status. However, a different latch assignment may be used.

In step 1826, the lower page data from WLn is read into data latches. In one embodiment, the lower page data is read into the set of DL1 latches. This may be an IDL.

In step 1828, upper page data is programmed into WLn. This step uses the data stored in the data latches to program the upper page data. One possible use of the data latches during step 1828 is as follows. The DL1 latches hold lower page data for WLn. The DL2 latches hold upper page data for WLn. This upper page data may be transferred from the controller 444. The DL3 latches may be used for verify status. However, a different latch assignment may be used.

One embodiment disclosed herein includes a method of operating non-volatile storage, comprising the following. A lower page bit is programmed into a selected non-volatile storage element on a NAND string. The selected non-volatile storage element having a first neighbor on one side of the NAND string and a second neighbor non-volatile storage element on the other side of the NAND string. An upper page bit is programmed into the first neighbor after programming the lower page bit into the selected non-volatile storage element. The selected non-volatile storage element is sensed after programming the upper page bit into the first neighbor and prior to programming an upper page bit into the second neighbor. The sensing comprising the following. A read reference voltage is applied to a control gate of the selected non-volatile storage element. A first read pass voltage is applied to a control gate of the first neighbor non-volatile storage element while applying the read reference voltage. The first read pass voltage is a delta greater than a read pass voltage that is applied to the first neighbor non-volatile storage element when reading the selected non-volatile storage element when an upper page bit is programmed on both neighbors. A second read pass voltage is applied to a control gate of the second neighbor non-volatile storage element. The second read pass voltage is the delta less than a read pass voltage that is applied to the second neighbor non-volatile storage element when reading the selected non-volatile storage element when an upper page bit is programmed on both neighbors. The NAND string is sensed in response to applying the read reference voltage, the first read pass voltage and the second read pass voltage.

One embodiment includes a non-volatile storage device, comprising a plurality of non-volatile storage elements, a plurality of word lines associated with the plurality of non-volatile storage elements, and one or more managing circuits in communication with the non-volatile storage elements and the plurality of word lines. The word lines include a target word line, a first neighbor word line on one side of the target word line and a second neighbor word line on the other side of the target word line. The one or more managing circuits program a lower page into non-volatile storage elements associated with the target word line. The one or more managing circuits program an upper page into non-volatile storage elements associated with the first neighbor word line after programming the lower page into the target word line. The one or more managing circuits sense the non-volatile storage element associated with the target word line to read back the lower page after programming the upper page into the first neighbor word line and prior to programming an upper page into non-volatile storage elements associated with the second neighbor word line. During the sensing, the one or more managing circuits apply a read reference voltage to the target word line. The second neighbor word line does not have an upper page programmed into its associated non-volatile storage elements during the sensing. The one or more managing circuits apply a first read pass voltage to the first neighbor word line while applying the read reference voltage to the target word line. The first read pass voltage is a delta greater than a read pass voltage that is applied to the first neighbor word line when reading selected non-volatile storage elements associated with the target word line when an upper page is programmed on both neighbor word lines. The one or more managing circuits apply a second read pass voltage to the second neighbor word line while applying the read reference voltage to the target word line. The second read pass voltage is a delta less than a read pass voltage that is applied to the second neighbor word line when reading non-volatile storage elements associated with the target word line when an upper page is programmed on both neighbor word lines, the one or more managing circuits store data for the selected non-volatile storage elements in response to the read reference voltage.

One embodiment includes a method of operating non-volatile storage comprising the following. Programming a first upper page into a first group of non-volatile storage elements associated with a first word line is started. The first group of non-volatile storage elements are to be programmed to a plurality of data states. Programming of the first upper page into the first group of non-volatile storage is paused in response to the first data state programming being complete. A lower page of data is read from a second group of non-volatile storage elements associated with a second word line while programing of the first upper page is paused. The second word line is adjacent to the first word line. The lower page of data is stored in a set of latches. The programming of the first upper page into the first group non-volatile storage elements is completed after storing the lower page. A second upper page of data is programmed into the second group non-volatile storage elements based on the lower page of data stored in the set of latches. The programming of the second page occurs after completing the programming of the first upper page into the first group of non-volatile storage elements.

In accordance with one embodiment, the programming of the second upper page includes the following. The first lower page of data is preserved in a set of latches while programming a second lower page of data in a third word line that is adjacent to the second word line. The second upper page of data is programmed into the second group non-volatile storage elements based on the preserved first lower page of data.

In accordance with one embodiment, the programming of the second upper page includes the following. The lower page is re-programmed into the second group of non-volatile storage elements based on the data stored in the set of latches. The lower page data that was re-programmed into the second group of non-volatile storage elements is read into the set of latches. The lower page data that was stored in the set of latches from the re-programming is used when programming the upper page of data into the second group non-volatile storage elements.

One embodiment includes a non-volatile storage device, comprising a plurality of NAND strings comprising non-volatile storage elements, a set of latches associated with the plurality of NAND strings, a plurality of word lines associated with the non-volatile storage elements, and one or more managing circuits in communication with the plurality of NAND strings, the set of latches, and the plurality of word lines. The word lines include a target word line, a first neighbor word line on one side of the target word line and a second neighbor word line on the other side of the target word line. The one or more managing circuits start to program a first upper page into a first group of the non-volatile storage elements associated with the first neighbor word line. The first group of non-volatile storage elements are to be programmed to a plurality of data states. The one or more managing circuits determine when programming of a first data state of the plurality of data states is complete. The one or more managing circuits pause programming of the first upper page into the first group of non-volatile storage elements in response to the first data state programming being complete. The one or more managing circuits read a lower page of data from a second group of the non-volatile storage elements associated with the target word line while the programming is paused. The one or more managing circuits store the lower page of data in the set of latches. The one or more managing circuits complete the programming of the first upper page into the first group non-volatile storage elements after storing the lower page. The one or more managing circuits program a second upper page of data into the second group non-volatile storage elements based on the lower page of data stored in the set of latches. The one or more managing circuits program the second page after the one or more managing circuits complete the programming of the first upper page into the first group of non-volatile storage elements.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical applications, to thereby enable others skilled in the art to best utilize various embodiments and with various modifications as are suited to the particular use contemplated. It is intended that the scope of embodiments be defined by the claims appended hereto.

What is claimed is:

1. A method of operating non-volatile storage, comprising:
   starting to program a first upper page into a first group of non-volatile storage elements associated with a first word line, the first group of non-volatile storage elements are to be programmed to a plurality of data states;
   pausing programming of the first upper page when programming of a first data state of the plurality of data states is complete;
   reading a lower page of data from a second group of non-volatile storage elements associated with a second word line while programming of the first upper page is paused, the second word line is adjacent to the first word line;
   storing the lower page of data in a set of latches;
   completing the programming of the first upper page into the first group non-volatile storage elements after storing the lower page; and
   programming a second upper page of data into the second group non-volatile storage elements based on the lower page of data stored in the set of latches, the programming of the second upper page occurs after completing the programming of the first upper page into the first group of non-volatile storage elements.

2. The method of claim 1, wherein the lower page of data is a first lower page of data, the programming a second upper page of data into the second group of non-volatile storage elements based on the first lower page stored in the set of latches comprises:
   preserving the first lower page of data in the set of latches while programming a second lower page of data in a third word line that is adjacent to the second word line; and programming the second upper page of data into the second group non-volatile storage elements based on the preserved first lower page of data.

3. The method of claim 1, wherein programming the second upper page of data into the second group non-volatile storage elements based on the lower page stored in the set of latches comprises:
   re-programming the lower page into the second group of non-volatile storage elements based on the data stored in the set of latches.

4. The method of claim 3, wherein the re-programming the lower page into the second group of non-volatile storage elements comprises:
   using a higher verify level compared to a verify level used when the lower page was previously programmed into the second group of non-volatile storage elements.

5. The method of claim 3, further comprising:
   reading, into the set of latches, the lower page data that was re-programmed into the second group of non-volatile storage elements; and
   using the lower page data that was read into the set of latches after the re-programming when programming the second upper page of data into the second group non-volatile storage elements.

6. The method of claim 1, wherein the plurality of data states include an erase state and three programmed states, the first data state is a lowest of the programmed states.

7. The method of claim 1, wherein each non-volatile storage element of the first group of non-volatile storage elements is part of one of a plurality of NAND strings, each non-volatile storage element of the second group of non-volatile storage elements is part of one of the plurality of NAND strings.

8. The method of claim 1, wherein the first group of non-volatile storage elements and the second group of non-volatile storage elements are included within in a three-dimensional memory array.

9. A non-volatile storage device, comprising:
   a plurality of non-volatile storage elements;
   a set of latches associated with the plurality of non-volatile storage elements;
   a plurality of word lines associated with the plurality non-volatile storage elements, the word lines include a target word line, a first neighbor word line on one side of the target word line and a second neighbor word line on the other side of the target word line; and
   one or more managing circuits in communication with the plurality non-volatile storage elements, the set of latches, and the plurality of word lines, the one or more managing circuits start to program a first upper page into a first group of the plurality of non-volatile storage elements associated with the first neighbor word line, the first group of non-volatile storage elements are to be programmed to a plurality of data states, the one or more managing circuits determine when programming of a first data state of the plurality of data states is complete, the one or more managing circuits pause programming of the first upper page into the first group of non-volatile storage elements in response to the first data state programming being complete, the one or more managing circuits read a lower page of data from a second group of the plurality of non-volatile storage elements associated with the target word line while the programming is paused, the one or more managing circuits store the lower page of data in the set of latches, the one or more managing circuits complete the programming of the first upper page into the first group non-volatile storage elements after storing the lower page of data in the set of latches, the one or more managing circuits program a second upper page of data into the second group non-volatile storage elements based on the lower page of data stored in the set of latches, the one or more managing circuits program the second upper page after the one or more managing circuits complete the programming of the first upper page into the first group of non-volatile storage elements.

10. The non-volatile storage device of claim 9, wherein the lower page of data is a first lower page, the one or more managing circuits preserve the first lower page of data in the set of latches while programming a second lower page of data in non-volatile storage elements associated with the second neighbor word line, the one or more managing circuits program the second upper page of data into the second group of non-volatile storage elements based on the preserved first lower page of data.

11. The non-volatile storage device of claim 9, wherein the one or more managing circuits re-program the lower page into the second group of non-volatile storage elements based on the data stored in the set of latches when programming the second upper page of data into the second group non-volatile storage elements based on the lower page stored in the set of latches.

12. The non-volatile storage device of claim 11, wherein the one or more managing circuits use a higher verify level when re-programming the lower page into the second group of non-volatile storage elements compared to when the one or more managing circuits previously programmed the lower page into the second group of non-volatile storage elements.

13. The non-volatile storage device of claim 11, wherein the one or more managing circuits read into the set of latches the lower page data that was re-programmed into the second group of non-volatile storage elements, the one or more managing circuits use the lower page data that was read into the set of latches after the re-programming when programming the upper page of data into the second group non-volatile storage elements.

14. The non-volatile storage device of claim 9, wherein the plurality of data states include an erase state and three programmed states, the first data state is a lowest of the three programmed states.

15. The non-volatile storage device of claim 9, further comprising:
   a three-dimensional memory array, the three-dimensional memory array comprising the non-volatile storage elements.

16. The non-volatile storage device of claim 9, wherein each non-volatile storage element of the first group of non-volatile storage elements is part of one of a plurality of NAND strings, each non-volatile storage element of the second group of non-volatile storage elements is part of one of the plurality of NAND strings.

17. A non-volatile storage device, comprising:
   a three-dimensional memory array comprising a plurality of non-volatile storage elements.
   a set of latches associated with the plurality of non-volatile storage elements;
   a plurality of word lines associated with the plurality of non-volatile storage elements, the plurality of word lines including a selected word line, a first neighbor word adjacent to the selected word line and a second neighbor word line adjacent to the selected word line; and
   managing circuitry in communication with the plurality of non-volatile storage elements, the set of latches, and the plurality of word lines, the managing circuitry programs a first lower page of data into a first group of the non-volatile storage elements associated with the first neighbor word line, the managing circuitry starts to program a first upper page into the first group of the non-volatile storage elements after programming the first lower page, the first group of non-volatile storage elements are to be programmed to a plurality of data states, the managing circuitry determines when programming of a first data state of the plurality of data states is complete, the managing circuitry pauses programming of the first upper page into the first group of non-volatile storage elements in response to the first data state programming being complete, the managing circuitry reads a second lower page of data from a second group of the non-volatile storage elements associated with the selected word line while the programming is paused, the managing circuitry stores the second lower page of data in the set of latches, the managing circuitry completes the programming of the first upper page into the first group non-volatile storage elements after storing the second lower page of data in the set of latches, the managing circuitry programs a second upper page of data into the second group non-volatile storage elements based on the second lower page of data stored in the set of latches, the managing circuitry programs the second upper page after the managing circuitry completes the programming of the first upper page into the first group of non-volatile storage elements.

18. The non-volatile storage device of claim 17, wherein the managing circuitry preserves the second lower page of data in the set of latches while programming a third lower page of data in non-volatile storage elements associated with the second neighbor word line, the managing circuitry programs the second upper page of data into the second group of non-volatile storage elements based on the preserved second lower page of data.

19. The non-volatile storage device of claim 17, wherein the managing circuitry re-programs the second lower page into the second group of non-volatile storage elements based on the data stored in the set of latches when programming the upper page of data into the second group non-volatile storage elements based on the second lower page stored in the set of latches.

20. The non-volatile storage device of claim 19, wherein the managing circuitry uses a higher verify level when re-programming the second lower page into the second group of non-volatile storage elements compared to when the managing circuitry previously programmed the second lower page into the second group of non-volatile storage elements.

* * * * *